(12) United States Patent
Masuda et al.

(10) Patent No.: US 7,823,618 B2
(45) Date of Patent: Nov. 2, 2010

(54) ULTRASONIC BONDING APPARATUS

(75) Inventors: Yasuyuki Masuda, Kawasaki (JP); Yukio Ozaki, Kawasaki (JP); Jun Matsueda, Kawasaki (JP); Kazuyuki Ikura, Kawasaki (JP); Taizan Kobayashi, Kawasaki (JP); Toshinori Kasuga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/564,444

(22) Filed: Sep. 22, 2009

(65) Prior Publication Data

US 2010/0006231 A1 Jan. 14, 2010

Related U.S. Application Data

(63) Continuation of application No. PCT/JP2007/056563, filed on Mar. 28, 2007.

(51) Int. Cl.
*B32B 37/00* (2006.01)
(52) U.S. Cl. .................... 156/580.1; 156/73.1; 156/281; 156/361; 156/494
(58) Field of Classification Search ............... 156/73.1, 156/281, 350, 361, 378, 494, 580.1, 580.2
See application file for complete search history.

(56) References Cited

U.S. PATENT DOCUMENTS

| 6,502,327 | B2 | 1/2003 | Kume et al. | |
|---|---|---|---|---|
| 2010/0006621 | A1* | 1/2010 | Masuda et al. | ............... 228/1.1 |
| 2010/0038406 | A1* | 2/2010 | Masuda et al. | ............... 228/102 |

FOREIGN PATENT DOCUMENTS

| JP | 56-003447 A | 1/1981 |
|---|---|---|
| JP | 60-234282 A | 11/1985 |
| JP | 02-260552 A | 10/1990 |
| JP | 04-090115 A | 3/1992 |
| JP | 05-345411 A | 12/1993 |
| JP | 06-038828 Y2 | 10/1994 |
| JP | 08-195063 A | 7/1996 |
| JP | 08-264584 A | 10/1996 |
| JP | 2562897 Y2 | 2/1998 |

(Continued)

OTHER PUBLICATIONS

International Search Report for PCT/JP2007/056563, Mailing Date of May 22, 2007.

*Primary Examiner*—James Sells
(74) *Attorney, Agent, or Firm*—Westerman, Hattori, Daniels & Adrian, LLP

(57) ABSTRACT

An ultrasonic bonding apparatus includes a head that includes a tool surface configured to mount an electronic component, an ultrasonic bonding unit configured to ultrasonically bond the electronic component with a substrate, and a wiping unit configured to wipe out pre-cured underfill that has adhered to the tool surface of the head, by using a wiping member on a wiping table. The wiping unit includes a solvent supply unit configured to supply a solvent configured to powder the underfill, to the wiping member on the wiping table, a sealed cartridge configured to house the wiping table and a feed mechanism configured to supply the wiping member to the wiping table and to roll up the wiping member from the wiping table, and a cartridge support member that includes a motor configured to drive the feed mechanism, and is detachably attached to the cartridge.

20 Claims, 20 Drawing Sheets

FOREIGN PATENT DOCUMENTS

| | | |
|---|---|---|
| JP | 2001-030465 A | 2/2001 |
| JP | 2002-053110 A | 2/2002 |
| JP | 2002-313837 A | 10/2002 |
| JP | 2003-249793 A | 9/2003 |
| JP | 2004-207294 A | 7/2004 |
| JP | 2004-342847 A | 12/2004 |
| JP | 2005-072033 A | 3/2005 |
| JP | 2005-302750 A | 10/2005 |

* cited by examiner

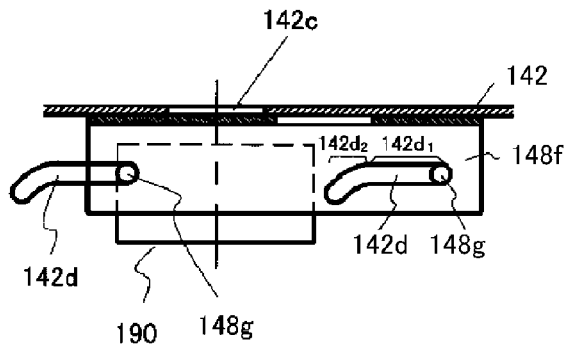 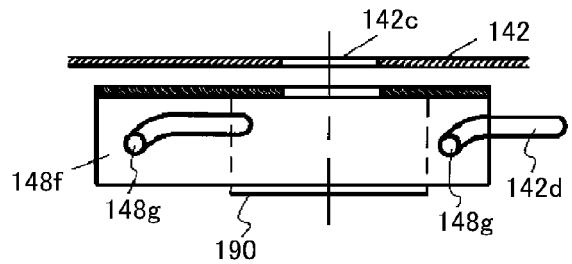
FIG. 15A    FIG. 15B
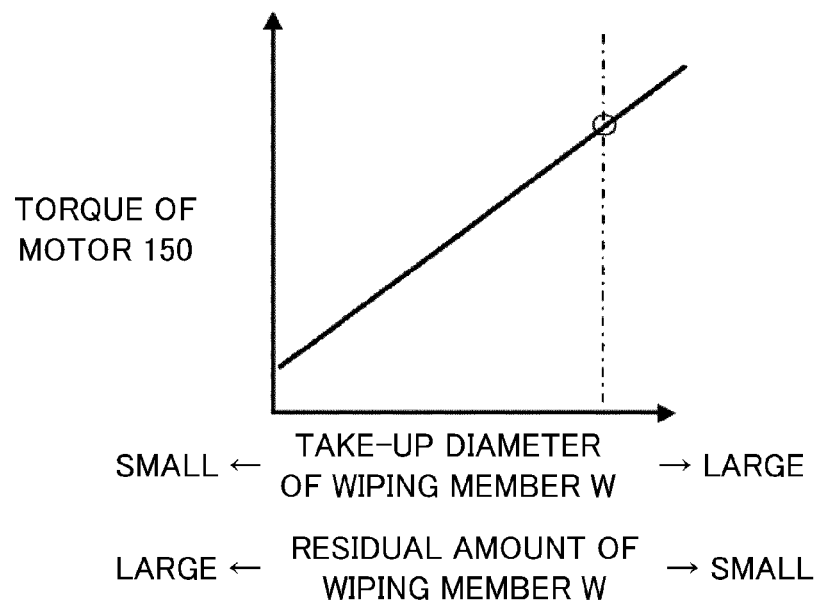
FIG. 16

ULTRASONIC BONDING APPARATUS

This application is a continuation based on International Application No. PCT/JP2007/056563.

BACKGROUND OF THE INVENTION

1. Field of the Invention

The present invention relates generally to an ultrasonic bonding (or welding) apparatus, and more particularly to an ultrasonic bonding apparatus configured to fill an underfill in a space between a chip (electronic component) and a substrate, and to bond the chip and the substrate with each other through the underfill. The present invention is suitable, for example, for an ultrasonic bonding apparatus configured to mount a bare chip (flip-chip: FC).

2. Description of the Related Art

Flip-chip mounting is a known technology alternative to wire bonding, which electrically connects a chip to a substrate via an array of bumps. The underfill is filled in a space between the chip and the substrate so as to mitigate an external stress and to improve the reliability of the connection. Recently, as a chip size reduces in order of a ball grid array ("BGA"), a chip size package ("CSP"), and the FC, an interval between the chip and the substrate becomes smaller. Thus, filling the underfill after mounting (this process will be referred to as "post-filling" of the underfill hereinafter) becomes difficult, and filling the underfill before mounting is necessary (this process will be referred to as "pre-filling" of the underfill hereinafter).

The ultrasonic bonding apparatus is mounted with the chip on a (tool) surface of an ultrasonic head on the substrate side, and bonds the chip onto the substrate by pressing the chip upon the substrate while applying the ultrasonic wave.

Prior art include, for example, Japanese Patent Applications, Publication Nos. 08-195063, 2001-30465, 56-3447, 05-345411, 2002-53110, 60-234282, 2002-313837, 02-260552, 2004-342847, 2004-207294, 2005-302750, 2005-72033, and 08-264584, Japanese Utility Model Publication No. 06-38828, Japanese Utility Model Registration No. 2,562,897, and Japanese Patent No. 2,987,386.

In the pre-filling, the chip is pressed and bonded while the underfill is being placed on the substrate. Therefore, the underfill under the chip is forced out in the press time, and adheres to and contaminates the tool surface. As the head's temperature becomes higher, the underfill that has adhered to the tool surface cures to lower the parallelism of the tool surface, and the transmissibility of the ultrasonic vibration deteriorates. As a result, the parallelism between the chip and the substrate degenerates, and the bonding quality becomes worse.

Since the ultrasonic bonding apparatus polishes the tool surface so as to maintain the flatness of the tool surface, the post-cured underfill can be eliminated through polishing. However, the pre-cured underfill cannot be removed by using the polishing machine because the pre-cured underfill clogs a polishing grindstone. In this respect, there is proposed a method for applying the ultrasonic wave while a film is held between the tool surface and the chip at the mounting time. However, this method can cause a transmission of the ultrasonic vibration to be insufficient, and a slide occurs on both surfaces of the inclusion (film) and the bonding quality becomes unstable.

SUMMARY OF THE INVENTION

The present invention provides an ultrasonic bonding apparatus configured to maintain a tool surface clean.

An ultrasonic bonding apparatus according to one aspect of the present invention used to manufacture an electronic device that includes a substrate, an electronic component, and an underfill that is filled in a space between the electronic component and the substrate includes a head that includes a tool surface configured to mount the electronic component, an ultrasonic bonding unit configured to ultrasonically bond the electronic component with the substrate, and a wiping unit configured to wipe out pre-cured underfill that has adhered to the tool surface of the head, by using a wiping member on a wiping table. The wiping unit includes a solvent supply unit configured to supply a solvent configured to powder the underfill, to the wiping member on the wiping table, a cartridge that is sealed, and configured to house the wiping table and a feed mechanism configured to supply the wiping member to the wiping table and to roll up the wiping member from the wiping table, and a cartridge support member that includes a motor configured to drive the feed mechanism, and is detachably attached to the cartridge. This ultrasonic bonding apparatus enables the cartridge to be exchanged in a unit of the cartridge, and facilitates the exchange operation. The exchange can be made in off-line, and the operating rate of the ultrasonic bonding apparatus improves. In addition, the motor can be arranged outside of the cartridge, and the cartridge may have an explosion-proof construction. The seal makes the cartridge waterproof, and maintains cartridge safe even when the solvent uses a flammable solution.

The ultrasonic bonding apparatus may further include a drive stage configured to drive the cartridge support member and attached to the cartridge support member. When the drive stage is arranged outside of the cartridge, the cartridge can have an explosion-proof construction.

An output shaft configured to associate with an operation of the feed mechanism may be projected from the cartridge in a sealed state. The cartridge support member may further include an output part connected to the output shaft, and a detector configured to detect a variation of the output part. The cartridge can have a simple structure by arranging the state detector outside of the cartridge, and maintains the explosion-proof mechanism. The ultrasonic bonding apparatus may further include a controller configured to recognize at least one of an end, a feed amount, and a residual amount of the wiping member based on a detection result of the detector. Thereby, the exchange timing of the wiping member and the wiping performance can be recognized. In addition, the operating rate of the ultrasonic bonding apparatus can be maintained.

The ultrasonic bonding apparatus may further include a brake plate provided to the cartridge support member, and configured to apply a tension to the wiping member against a rotation force of the motor, a take-up reel that has a first shaft projecting from the cartridge in a sealed state, and is configured to roll up the wiping member from the wiping table, and a feed reel that has a second shaft projecting from the cartridge in a sealed state, and is configured to feed the wiping member to the wiping table. One of a motor shaft of the motor and a rotation shaft of the brake plate is connected to the first shaft, and the other is connected to the second shaft. The tension when applied to the wiping member can remove a slack and maintain the wiping performance. The ultrasonic bonding apparatus may further include a controller configured to adjust the tension applied to the wiping member. Thereby, it is possible to adjust the tension in accordance with a state of the wiping member and to maintain the wiping performance.

Each of the first shaft and the second shaft may have a projection that has a pair of bevel surfaces having different inclination angles so that the first shaft can rotate to slack the wiping member when the first shaft is connected to the one and the second shaft can rotate to slack the wiping member when the second shaft is connected to the other. Even when the first shaft can be surely connected to the one and the second shaft can be surely connected to the other when the cartridge is connected to the cartridge support member even when their phases shift.

An ultrasonic bonding apparatus according to another aspect of the present invention used to manufacture an electronic device that includes a substrate, an electronic component, and an underfill that is filled in a space between the electronic component and the substrate includes a head that includes a tool surface configured to mount the electronic component, an ultrasonic bonding unit configured to ultrasonically bond the electronic component with the substrate, and a wiping unit configured to wipe out pre-cured underfill that has adhered to the tool surface of the head, by using a wiping member on a wiping table. The wiping unit includes a cartridge configured to house the wiping table, a cartridge support member detachably attached to the cartridge, and a drive stage configured to drive the cartridge support member and attached to the cartridge support member. The ultrasonic bonding apparatus may further include a first orientation adjuster configured to adjust an orientation of the wiping member on the wiping table so that the wiping member can be parallel to the tool surface, the first orientation adjuster being provided between the cartridge support member and the drive stage. According to this ultrasonic bonding apparatus, the first orientation adjuster can make the contact pressure between the tool surface and the wiping member uniform in a plane at the wiping time. As a result, the wipe operation becomes stable, and the underfill can be surely wiped out to extend the life of the head.

The ultrasonic bonding apparatus may further include a second orientation adjuster fixed onto the drive stage on a side opposite to the cartridge support member and configured to adjust an orientation of the drive stage. According to this ultrasonic bonding apparatus, the second orientation adjuster can make the contact pressure between the tool surface and the wiping member uniform in a plane at the wiping time. As a result, the wipe operation becomes stable, and the underfill can be surely wiped out to extend the life of the head.

The drive stage may swing the cartridge support member when the wiping unit provides wiping. According to this ultrasonic bonding apparatus, the same actuator serves as means for moving the cartridge to the wiping position and swinging means for wiping, making the cartridge mechanism simple, and reducing the cost.

The ultrasonic bonding apparatus may further include a swing mechanism configured to swing the wiping table relative to the cartridge when the wiping unit provides wiping. According to this ultrasonic bonding apparatus, since the mass of the object to be swung becomes smaller in comparison with the mass when the cartridge and cartridge support member are entirely swung, the vibrations reduce. In addition, the drive stage does not need to swing, the power consumption can be smaller, and the cost can be reduced. The swing mechanism includes, for example, a decentering cam inserted into a cavity formed in the wiping table, and a motor connected to the decentering cam, provided on the cartridge support member, and configured to drive the decentering cam.

The ultrasonic bonding apparatus may further include a clamp mechanism configured to clamp the wiping member onto the wiping table, and an unclamp mechanism configured to release a clamp by the clamp mechanism. Thereby, even when the wiping table swings, the wiping member can follow it. For example, the clamp mechanism includes a press plate configured to press the wiping member on the wiping table, and a forcing member configured to force the press plate in a clamping direction, and the unclamp mechanism includes a unit to displace the press plate against a force applied by the forcing member. Alternatively, each of the claim mechanism and the unclamp mechanism may includes a shutter housed in the cartridge, and configured to expose and close the wiping member on the wiping table, and a movement mechanism configured to move the shutter between an open position at which the shutter exposes and clamps the wiping member, and a close position at which the shutter closes and unclamps the wiping member.

The ultrasonic bonding apparatus may further include an elastic member located between the wiping table and the wiping member. According to this ultrasonic bonding apparatus, the pressure distribution on the tool surface is likely to be uniform. As a result, the tool surface can be wiped out averagely, the wipe operation becomes stable, the underfill can be surely wiped out, and the life of the head can be extended. Alternatively, the wiping table may have an uneven surface configured to contact the wiping member so as to achieve a similar effect.

An ultrasonic bonding apparatus according to still another aspect of the present invention used to manufacture an electronic device that includes a substrate, an electronic component, and an underfill that is filled in a space between the electronic component and the substrate includes a head that includes a tool surface configured to mount the electronic component, an ultrasonic bonding unit configured to ultrasonically bond the electronic component with the substrate, and a wiping unit configured to wipe out pre-cured underfill that has adhered to the tool surface of the head, by using a wiping member on a wiping table. The wiping unit includes the wiping table, a shutter configured to expose and close the wiping member on the wiping table, and a feed mechanism configured to supply the wiping member to the wiping table and to roll up the wiping member from the wiping table, in association with opening of the shutter. According to this ultrasonic bonding apparatus, the shutter serves as part of the feed mechanism, and the feed mechanism does not need a driving motor. The feed mechanism may includes a one-way clutch attached to a shaft of one of a take-up reel configured to take up the wiping member from the wiping table, and a feed reel configured to feed the wiping member to the wiping table, the one-way clutch rotating the shaft in association with the opening of the shutter, and a rack and pinion connected to the shutter and the one-way clutch.

Further features of the present invention will become apparent from the following description of exemplary embodiments with reference to the attached drawings.

BRIEF DESCRIPTION OF THE DRAWINGS

FIGS. 15A and 15B are schematically sectional views showing another example of the clamping/unclamp mechanism shown in FIGS. 13A and 13B.

FIG. 16 is a graph showing a relationship between a residual amount of a wiping member in a feed reel shown in FIG. 3 or a take-up diameter of a take-up roller, and a torque of a motor.

DESCRIPTION OF THE EMBODIMENTS

Figure 1:
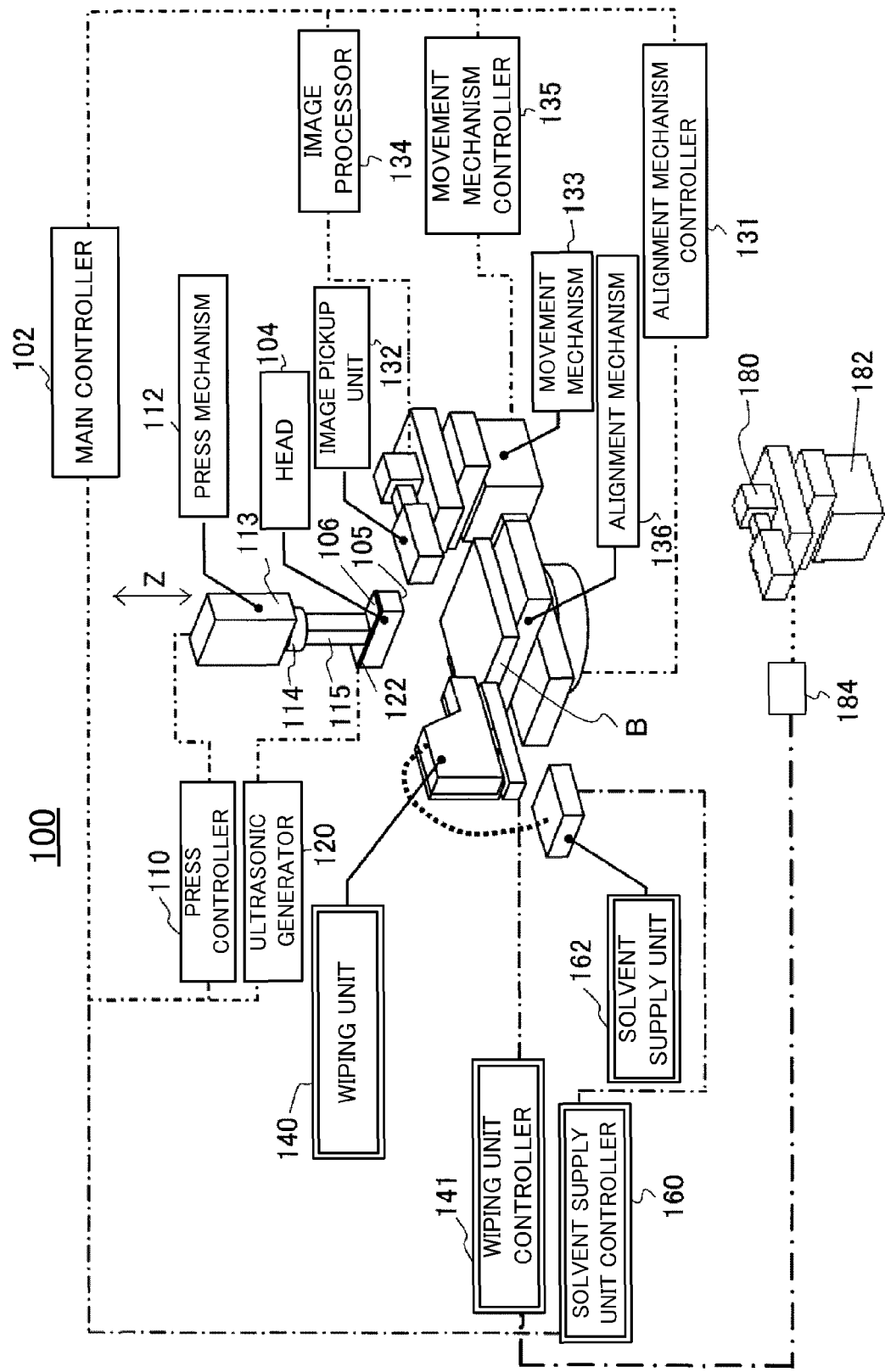
FIG. 1 is a block diagram of an ultrasonic bonding apparatus according to one aspect of the present invention.
Figure 2:
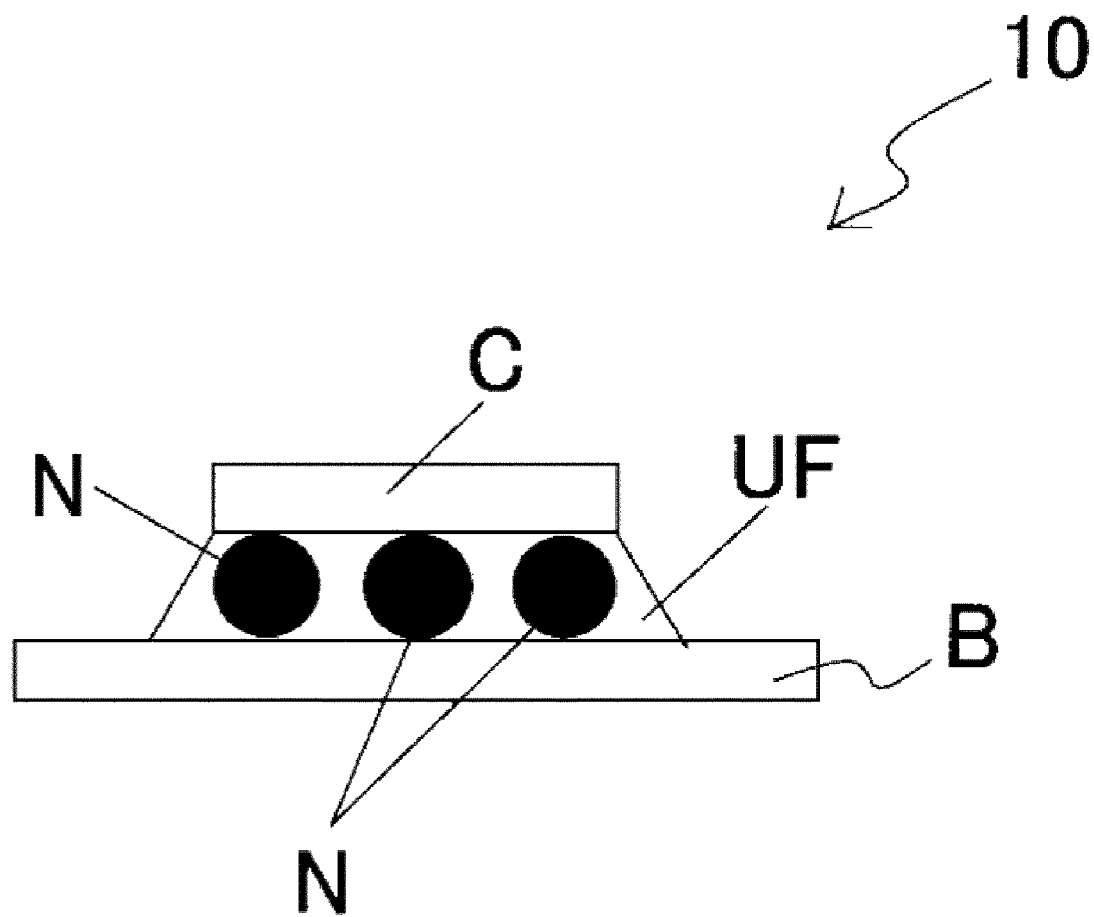
FIG. 2 is a schematic sectional view of an electronic device manufactured by the ultrasonic bonding apparatus shown in FIG. 1.

Referring now to FIGS. 1 and 2, a description will be given of an ultrasonic bonding apparatus 100 according to one aspect of the present invention. FIG. 1 is a block diagram of the ultrasonic bonding apparatus 100. FIG. 2 is a schematic sectional view of the electronic device 10.

The ultrasonic bonding apparatus 100 is an apparatus used to manufacture the electronic device 10 shown in FIG. 2, and serves to ultrasonically bond a chip (electronic component) C with a substrate B. The electronic device 10 includes a substrate B, a chip C mounted onto or electrically connected to the substrate B via bumps N, and an underfill UF filled in a space between the chip C and the substrate B. More specifically, each bump N is connected to the chip C and the substrate B via a pad (not shown).

The ultrasonic bonding apparatus 100 includes, as shown in FIG. 1, a main controller 102, a head 104, an ultrasonic bonding unit, an alignment unit, and a wiping unit 140.

The main controller 102 is connected to the ultrasonic bonding unit, the alignment unit, the wiping unit 140, and other various types of controllers, and controls each component. The main controller 102 is a processor, such as a MPU or CPU, a memory, such as a ROM, a RAM, or a hard disc drive, and an input unit, such as a keyboard or a mouse, and an indicator, such as a display. Each of the other controllers, which will be described later, also has a memory.

The head 104 includes, on the bottom side, a tool surface 105 configured to mount the chip (electronic component) C. The bottom of the head 104 may be flat or have concaves. In FIG. 1, the tool surface 105 is not seen. The tool surface 105 opposes to the substrate B. The head 104 is provided with an ultrasonic transducer 122, but a member connected to the head 104 may possess it. A press mechanism 112 is attached to a top surface 106 of the head 104 that is opposite to the tool surface 105. The head 104 may be exchanged according to a type of the chip C.

The ultrasonic bonding unit serves to ultrasonically bond the chip C with the substrate B, and includes a press unit and an ultrasonic applicator. The press unit is a driver configured to drive the head in a Z direction in which the chip C is pressed against the substrate B, and includes a press controller 110 and the press mechanism 112.

The press controller 110 is connected to the main controller 102, and its operation is controlled by the main controller 102. The press controller 110 controls the press mechanism 112.

The press mechanism 112 includes a body 113 and a drive shaft 115. The body 113 includes a Z stage that can expand and constrict the drive shaft in the Z direction. One end of the drive shaft 115 is connected to the body 113 directly or indirectly via a load sensor 114 as a detector, and the other end of the drive shaft 115 is fixed onto the top surface 106 of the head 104. The drive shaft 115 has a heater (not shown), and the temperature of the heater is controlled by the press controller 110.

The ultrasonic applicator applies the ultrasonic wave to the chip C on an XY plane orthogonal to the Z direction, and includes an ultrasonic generator 120 and an ultrasonic transducer 122. The ultrasonic generator 120 converts an electric signal, for example, of 50 Hz into an electric signal of 20 kHz or 35 kHz. The ultrasonic transducer 122 includes a piezoelectric element configured convert an electric signal into the mechanical vibration energy. The ultrasonic transducer 122 transmits a vibration to the head 104 via a horn (resonance member) (not shown).

The ultrasonic applicator can use a structure known in the art, and a description thereof will be omitted.

The alignment unit provides an alignment between the chip C and the substrate B, and includes an alignment mechanism controller 131, an image pickup unit 132, a movement mechanism 133, an image processor 134, a movement mechanism controller 135, and an alignment mechanism 136.

The alignment mechanism controller 131, the image processor 134, and the movement mechanism controller 135 are controlled by the main controller 102. The alignment mechanism controller 131 controls an operation of the alignment mechanism 136 based on a result of the image processor 134.

The image pickup unit 132 has a camera, and can take images of the top and bottom surfaces or the tool surface 105 and the substrate B. More specifically, the image pickup unit 132 takes images of a mark (not shown) formed on the tool surface 105 and aligned with the chip C, and a mark (not shown) formed on the substrate B near the chip mounting position and aligned with the chip mounting position.

The image pickup unit 132 is driven by the movement mechanism 133. The movement mechanism 133 includes a three-dimensional stage, and three-dimensionally moves the image pickup unit 132. The image processor 134 processes both mark images taken by the image pickup unit 132 and superimposes both marks when they are viewed from the Z direction.

The movement mechanism controller 135 controls driving of the movement mechanism 133. More specifically, in photographing the marks, the image pickup unit 132 is moved to the image pickup position, and in ending the alignment, the image pickup unit 132 is retreated.

The alignment mechanism 136 is a three-dimensional stage mounted with the substrate B, and can move the substrate B in the three-dimensional direction. In operation, the alignment mechanism controller 131 obtains an image pickup result from the image processor 134, and controls driving of the alignment mechanism 136 so that both marks can overlap each other in a predetermined positional relationship.

The alignment unit can apply a structure known in the art, and a detailed description thereof will be omitted.

The wiping unit 140 serves to wipe out the underfill UF that has adhered to the tool surface 105 of the head 104, by using the wiping member W. The ultrasonic bonding apparatus 100 of this embodiment adopts the pre-filling method in which the head 104 is pressed against the substrate B while the underfill UF is previously applied onto the substrate B. Therefore, the underfill UF is likely to adhere to the tool surface 105 when the head 104 is pressed upon the substrate B. The wiping unit 140 wipes out the underfill UF and maintains the tool surface 105 clean.

The wiping member W is a tape or stripe member used to wipe out the underfill UF. In this embodiment, the wiping member W is made of cloth but the present invention does not limit its material.

Figure 3:
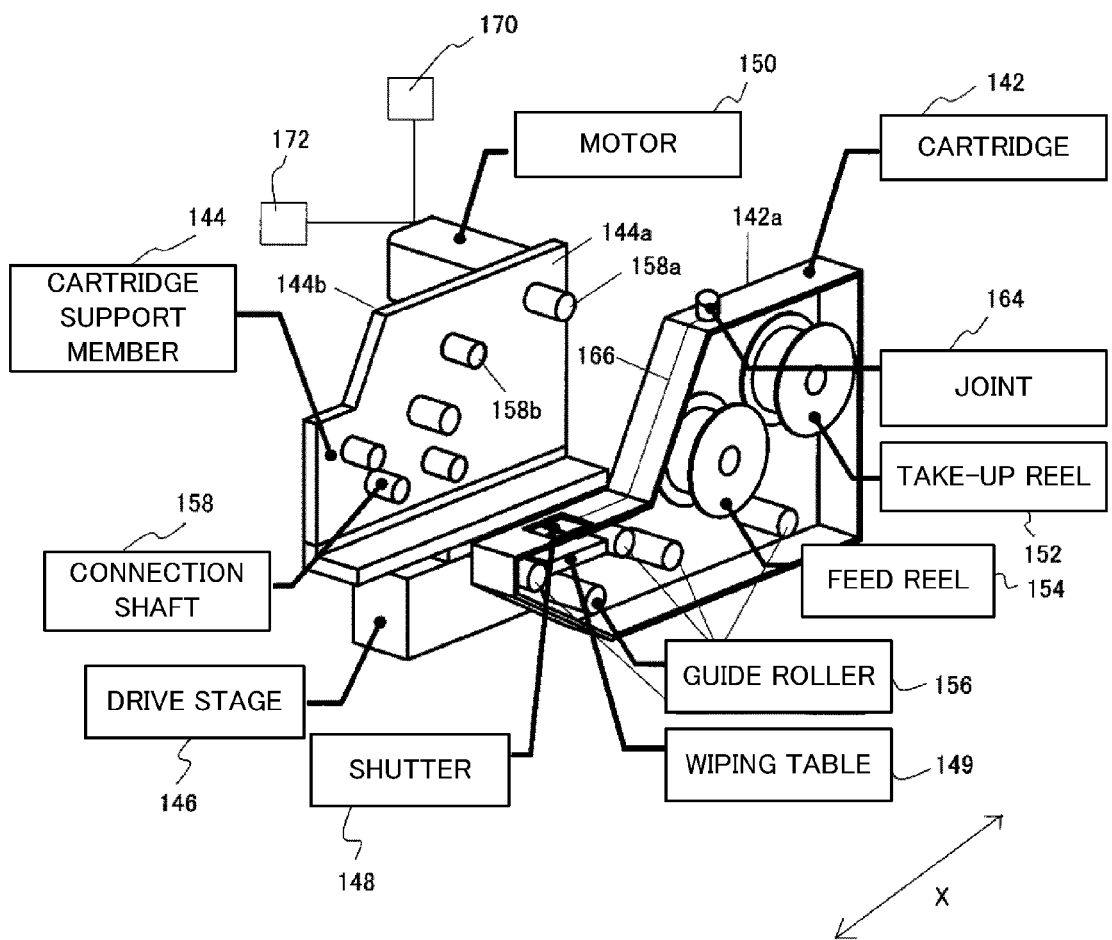
FIG. 3 is an exploded perspective view of a wiping unit shown in FIG. 1 on a front surface side.
Figure 4:
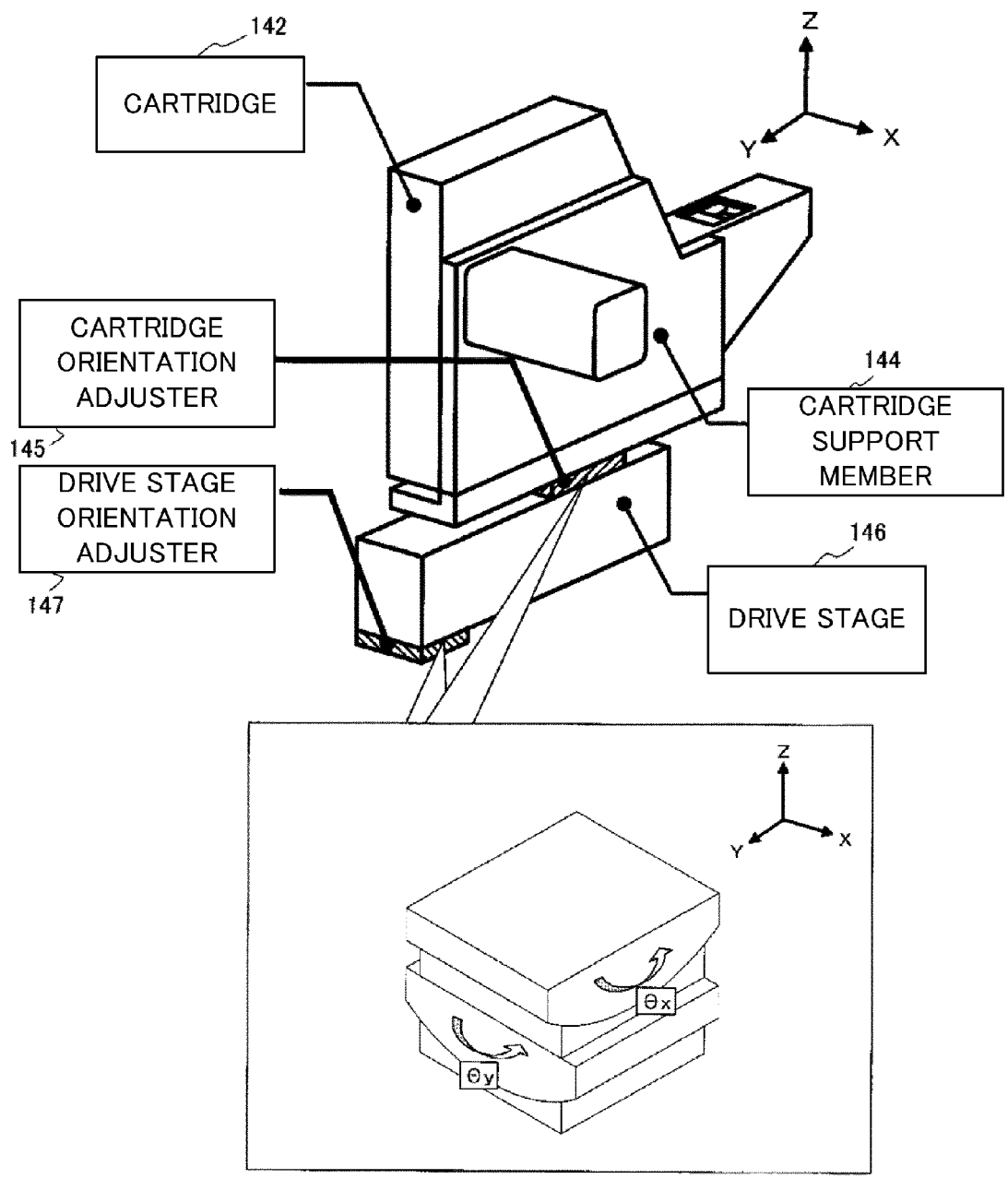
FIG. 4 is a perspective view of the wiping unit shown in FIG. 3 on a back surface side.

The wiping unit 140 includes, as shown in FIGS. 1, 3-20, a body, a feed system, a state detection system, a solvent supply system, and a timing control system. FIG. 3 is an exploded perspective view of the wiping unit 140 when it is viewed from the front side, and FIG. 4 is a perspective view of the wiping unit 140 when it is viewed from the rear side.

The body includes a wiping unit controller 141, a cartridge 142, a cartridge support member 144, a cartridge orientation adjuster 145, a drive stage 146, a drive stage orientation adjuster 147, a shutter 148, and a wiping table 149.

The wiping unit controller 141 controls a movement of the drive stage 146 in the X direction, and is controlled by the press controller 110.

The cartridge 142 is an approximately L-shaped hollow housing, and can be engaged with and disengaged from the cartridge support member 144 on the surface 142*a*. The cartridge 142 can be separated from the cartridge support member 144, and thus an attachment, a detachment, or an exchange can be performed in a unit of the cartridge 142. As a result, an exchange and maintenance of the wiping member W can become easy, and the number of operational steps can be saved. In addition, the wiping member W can be exchanged in an off-line operation, and the operating rate of the wiping unit 140 improves.

Since the solvent is used and the solvent can use flammable solution, such as alcohol, as described later, the cartridge 142 may be made of a waterproof and explosion-proof construction. The cartridge 142 has an airtight structure for a waterproof construction, as described later. No motor or sensor is provided in the cartridge 142 for the explosion-proof structure, and the internal state is detected from the outside.

The cartridge 142 has a box frame shape, and houses the wiping member W, the wiping table 149, a take-up reel 152, a feed reel 154, and a plurality of guide rollers 156. Although the cover 143 is detached in FIG. 3, the cover 143 is attached to the cartridge 142 as shown in FIG. 6, which will be described later, so as to close the cartridge 142.

The cartridge 142 is attached to the drive stage 146 via the cartridge support member 144. The cartridge 142 and the cartridge support member 144 are integrally moved to and retreated from the wiping position by the drive stage 146. At the wiping time, the cartridge 142 and the cartridge support member 144 are swung as one member by the drive stage 146. However, as described in another embodiment, which will be described later, only part of the member housed by the cartridge 142, such as the wiping table 149, may be swung.

The cartridge support member 144 has an L shape, as shown in FIG. 3, and includes a variety of drive systems and detection systems. The cartridge support member 144 is connected to the drive stage 146 on the bottom surface of the L-shaped bottom plate, and can be driven in the X direction by the drive stage 146. The cartridge support member 144 can be engaged with and disengaged from the cartridge 142 on the surface 144*a* that is one surface of an L-shaped erector, and the motor 150 and a detection system are attached to a surface 144*b* that is another surface of the L-shaped erector.

The cartridge orientation adjuster 145 is arranged between the cartridge support member 144 and the drive stage 146, as shown in FIG. 4, and is a following mechanism of adjusting an orientation ($\theta x$, $\theta y$) of the wiping member W on the wiping table 149 of the cartridge 142 so that the wiping member W can be parallel to the tool surface 105. As a result, the contact pressure between the wiping member W and the tool surface 105 can be made uniform in a surface at the wiping time.

The cartridge orientation adjuster 145 can eliminate shifts caused by the individual differences of the cartridge 142, and adjust an orientation of the cartridge 142 when the head 104 is replaced and when the cartridge 142 is replaced. This adjustment may be manual or automatic. The cartridge orientation adjuster 145 prevents a point contact between the wiping member W and the tool surface 105 at the wiping time, and provides the average wiping to the entire tool surface 105. As a result, the wipe operation becomes stable, and the underfill UF can be surely wiped out so as to extend the life of the head 104. The cartridge orientation adjuster 145 includes a stage that can independently rotate around the X axis (θx) and around the Y axis (θy), as shown in a detailed perspective view at the bottom of FIG. 4.

The drive stage 146 is fixed onto the cartridge support member 144, and moves the cartridge support member 144 to the wiping position along the X direction, and retreats the cartridge support member 144 from the wiping position along the X direction. The X direction is a direction perpendicular to the Y direction that is the ultrasonic oscillation direction. In this embodiment, the ultrasonic oscillation direction is perpendicular to the wiping direction.

Figure 5:
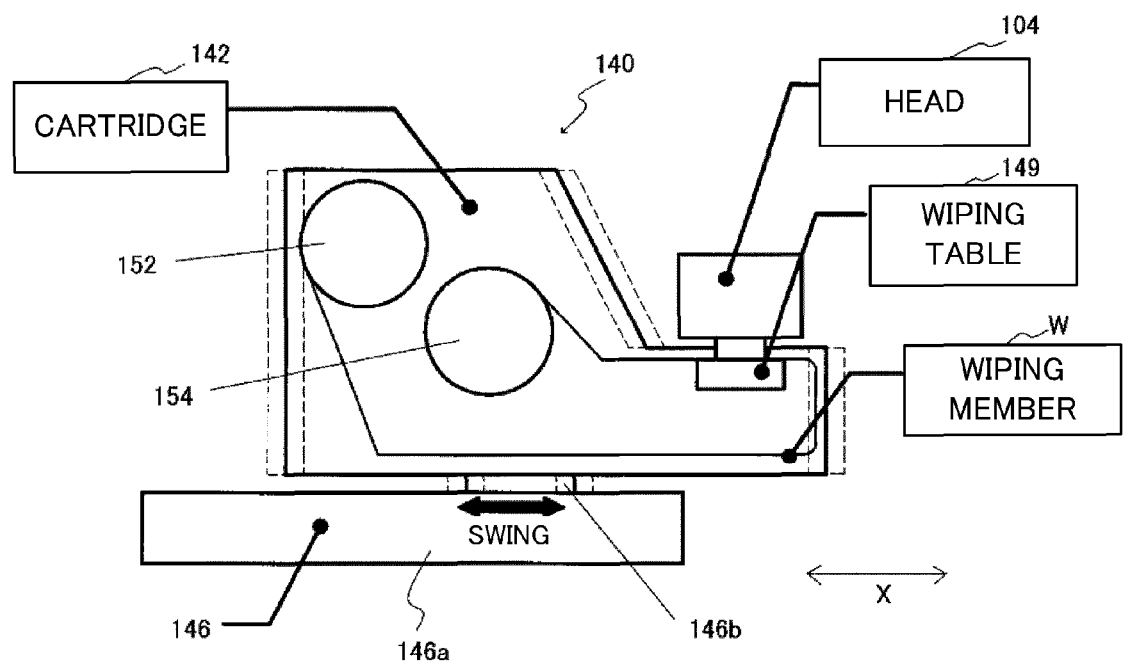
FIG. 5 is a schematic sectional view showing one example of a swing mechanism applicable to the wiping unit shown in FIG. 3.

In one embodiment, the wiping unit controller 141 controls the drive stage 146 to swing the cartridge support member 144 in the X direction at the wiping time. FIG. 5 shows this state. FIG. 5 is a schematic sectional view of the wiping unit 140. In FIG. 5, the cartridge orientation adjuster 145 and the drive stage orientation adjuster 147 are omitted. In FIG. 5, the drive stage 146 includes a fixed member 146a, and a movable member 146b that swings in an arrow direction (X direction) relative to the fixed member 146a. The movable member 146b swings in a range between dotted positions before and after the solid line position.

Thus, for wiping of the tool surface 105, the entire cartridge 142 is moved parallel to the tool surface 105 by the drive stage 146. Since the same actuator serves both as means for moving the cartridge 142 to the wiping position and means for swinging for wiping, the mechanism of the cartridge 142 can be made simple and the cost can be reduced.

The drive stage orientation adjuster 147 is fixed under the drive stage 146, and is a following mechanism configured to adjust an orientation (θx, θy) of the drive stage 146. The drive stage orientation adjuster 147 adjusts the orientation of the drive stage 146 so that the pressure between the wiping member W and the tool surface 105 can be constant in the plane of the tool surface 105 over the wiping stroke. The drive stage orientation adjuster 147 can eliminate shifts caused by the individual differences of the head 104, and adjusts an orientation of the drive stage 146 when the head 104 is replaced. This adjustment may be manual or automatic. The drive stage orientation adjuster 147 prevents a point contact of the tool surface 105 at the wiping time, and provides average wiping to the entire tool surface 105. As a result, the wipe operation becomes stable, the underfill UF can be surely wiped out, and the life of the head 104 can be extended. The drive stage orientation adjuster 147 includes a stage that can rotate independently around the X axis (θx) and around the Y axis (θy) as shown in the detailed perspective view at the bottom of FIG. 4.

The shutter 148 is provided over the wiping table 149. When the shutter 148 opens, the wiping member W exposes on the wiping table 149. The wiping table 149 is formed in the cartridge 142 in this embodiment, and a bottom of the head 104 is inserted into the shutter 148 down to the wiping member W above the wiping table 149 while the tool surface 105 faces down. The wiping table 149 may be formed on a convex of the cartridge 142, and the bottom of the head 104 may be made flat.

When the shutter 148 is closed, it seals the wiping member W above the wiping table 149. The shutter 148 is opened and closed by the wiping unit controller 141, and the shutter 148 or a shutter opening/closing mechanism (not shown) connected to the shutter 148.

The wiping member W is supplied to the top of the wiping table 149, and used to wipe out the underfill UF on the tool surface 105. The wiping table 149 is supplied with the clean wiping member W, and the dirty wiping member W on the wiping table 149 is rolled up. The press mechanism 112 can press the tool surface 105 of the head 104 upon an exposed part of the wiping member W above the wiping table 149. At the wiping time, the tool surface 105 is not mounted with the chip C.

Figure 6A:
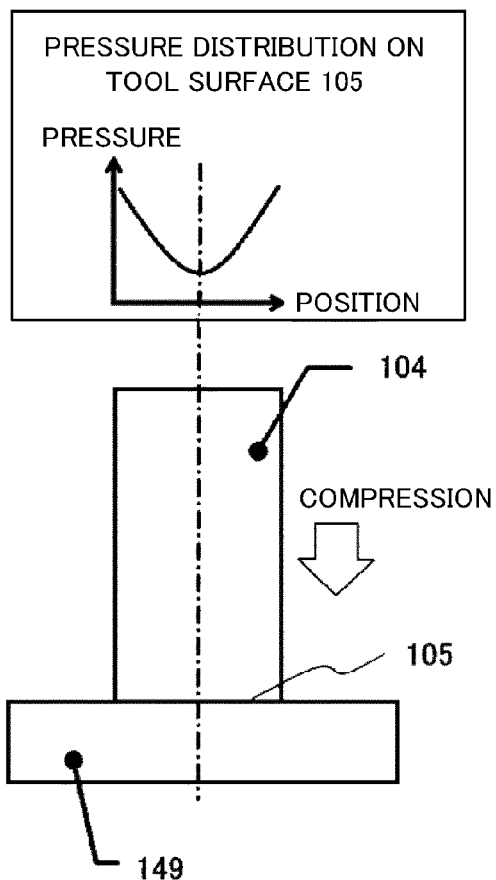
FIG. 6A is a schematic sectional view of a pressure distribution on a tool surface and its state when a head is pressed against a wiping table with no elastic member.
Figure 6B:
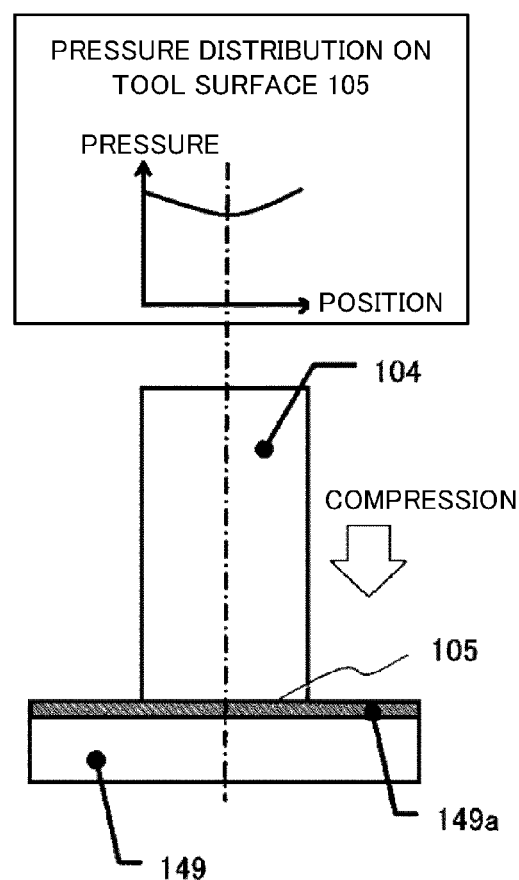
FIG. 6B is a schematic sectional view of a pressure distribution on a tool surface and its state when the head is compressed against the wiping table with an elastic member.

As shown in FIGS. 6A and 6B, the wiping table 149 may be covered with an elastic member 149a, and configured to contact the wiping member W via the elastic member 149a. FIG. 6A is a schematic sectional view showing the pressure distribution of the tool surface 105 and its state when the head 104 is pressed against the wiping table 149 with no elastic member 149a. FIG. 6B is a schematic sectional view showing the pressure distribution of the tool surface 105 and its state when the head 104 is pressed against the wiping table 149 via the elastic member 149a. In FIGS. 6A and 6B, the wiping member W is omitted.

It is difficult to make both the top surface of the wiping table 149 and the tool surface 105 perfectly flat, and to maintain them perfectly parallel to each other. Hence, as shown in an upper graph of FIG. 6A, the pressure distribution of the tool surface 105 is likely to become non-uniform when there is no elastic member 149a. On the other hand, when there is the elastic member 149a as shown in FIG. 6B, the pressure distribution of the tool surface 105 is likely to become uniform. As a result, the tool surface 105 can be wiped out averagely, the wipe operation becomes stable, the underfill UF can be surely wiped out, and the life of the head 104 can be extended.

Figure 7A:
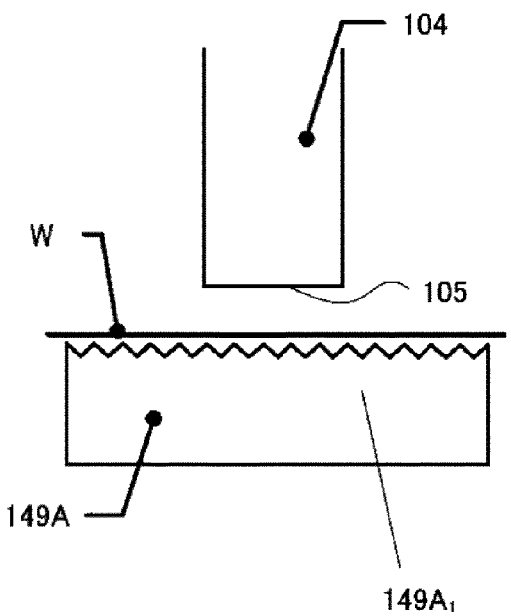
FIG. 7A is a schematic sectional view before the head is pressed against a wiping table having a rough surface.
Figure 7B:
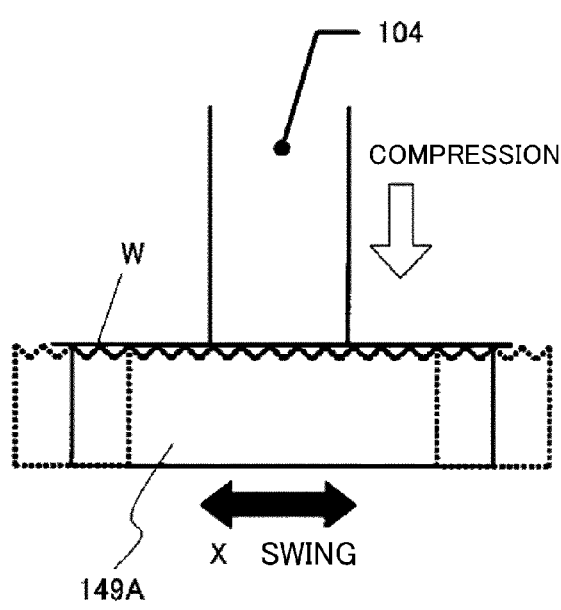
FIG. 7B is a schematic sectional view showing that the head is pressed against and swung on the wiping table shown in FIG. 7A.

A wiping table 149A may be used which has an uneven surface that is made by forming convexes and concaves on the surface of the wiping table 149. FIG. 7A is a schematic sectional view before the head 104 is pressed upon the wiping table 149A having an uneven surface $149A_1$. FIG. 7B is a schematic sectional view when the head 104 is pressed upon the wiping table 149A and swung. Each convex of the uneven surface $149A_1$ has the same height, and the same triangular prism shape. However, the present invention does not limit the shape of the convex, such as a conical shape.

When the wiping table 149 has a plane surface and surface-contacts the tool surface 105, the surface of the wiping table 149 may not follow fine uneven shape on the tool surface 105. Point contacts or a surface contact in a fine area using the uneven surface $149A_1$ provides average wiping of the entire tool surface 105. As a result, the wipe operation becomes stable, the underfill UF can be surely wiped out, and the life of the head 104 can be extended.

Figure 8:
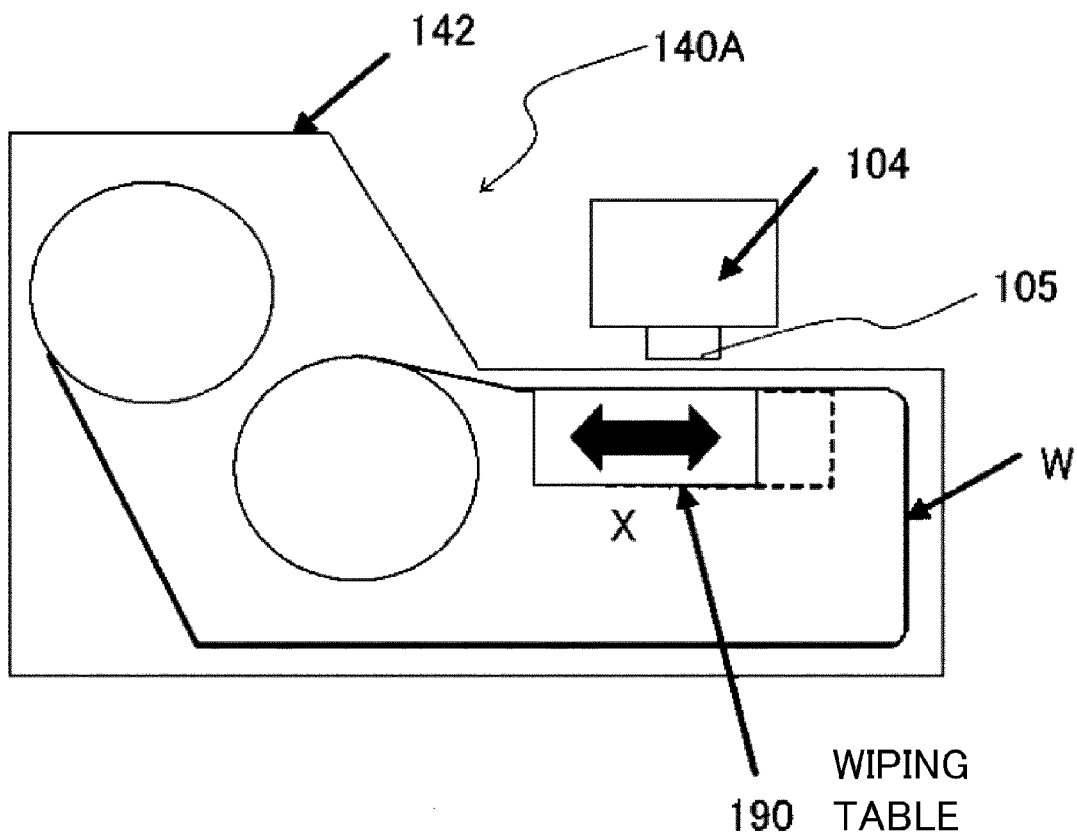
FIG. 8 is a schematic sectional view of a wiping unit having a variation of the swing mechanism shown in FIG. 5.

While the cartridge 142 entirely swings in the example shown in FIG. 5, only the wiping table 149 may swing. Referring now to FIGS. 8 to 12, a description will be given of an embodiment having such a wiping table 190. FIG. 8 is a schematic sectional view of the wiping unit 140A having the wiping table 190. As shown in FIG. 8, the cartridge 142 is fixed, and only the wiping table 190 swings in the X direction in a range enclosed by a dotted line and a solid line.

Figure 9:
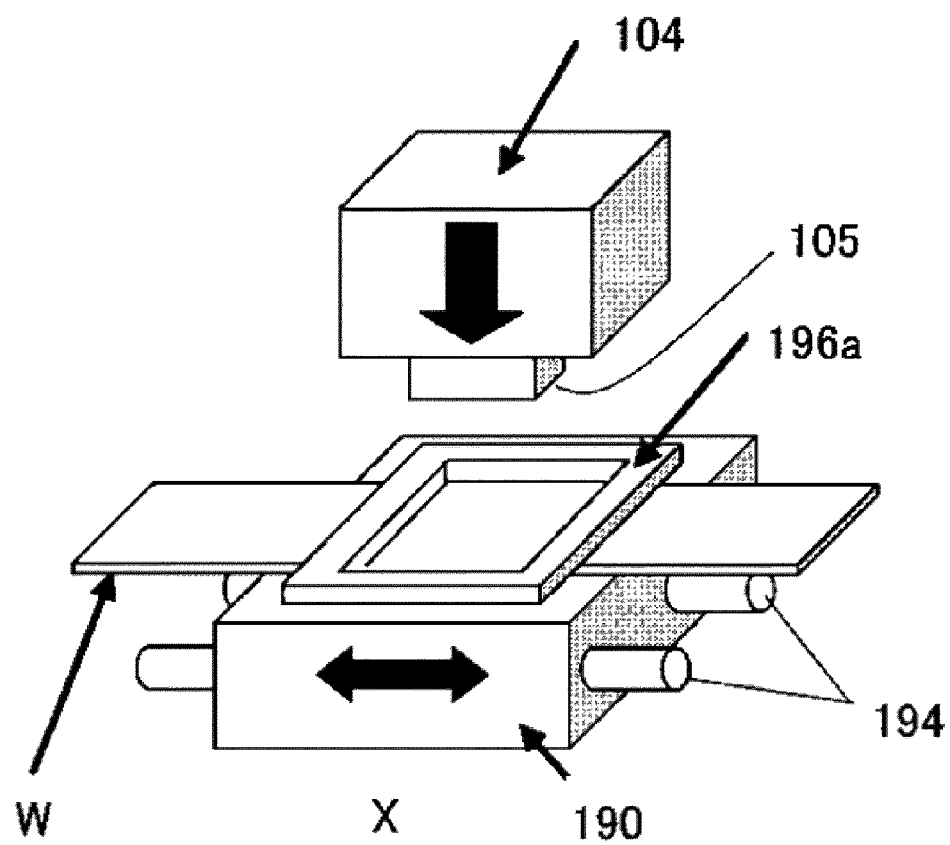
FIG. 9 is a schematically enlarged perspective view near the wiping table of the wiping unit shown in FIG. 8.
Figure 10:
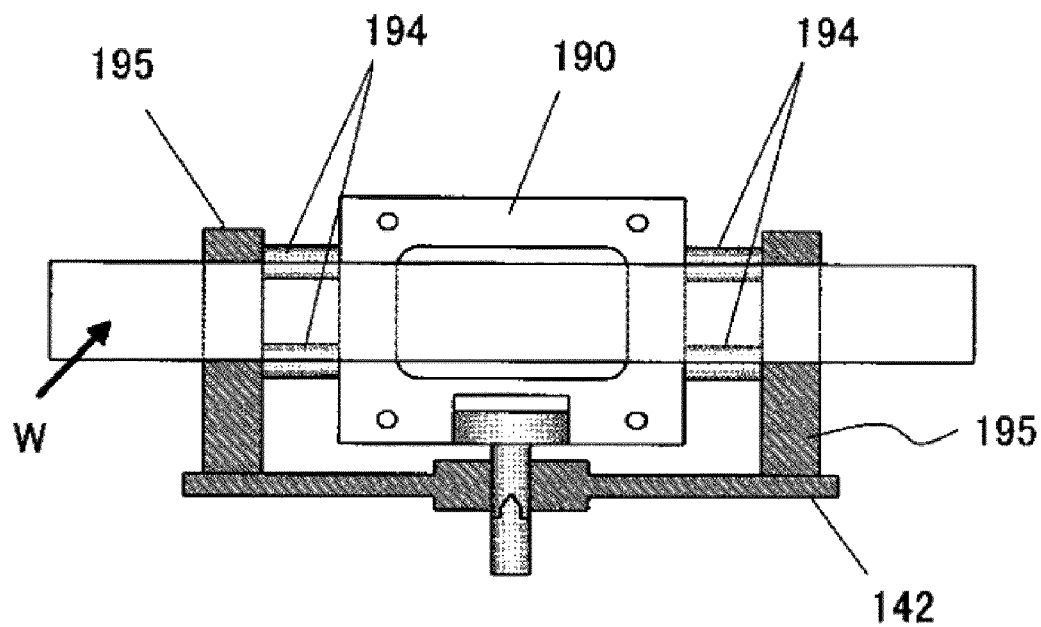
FIG. 10 is a plane view of the wiping unit shown in FIG. 8.
Figure 11:
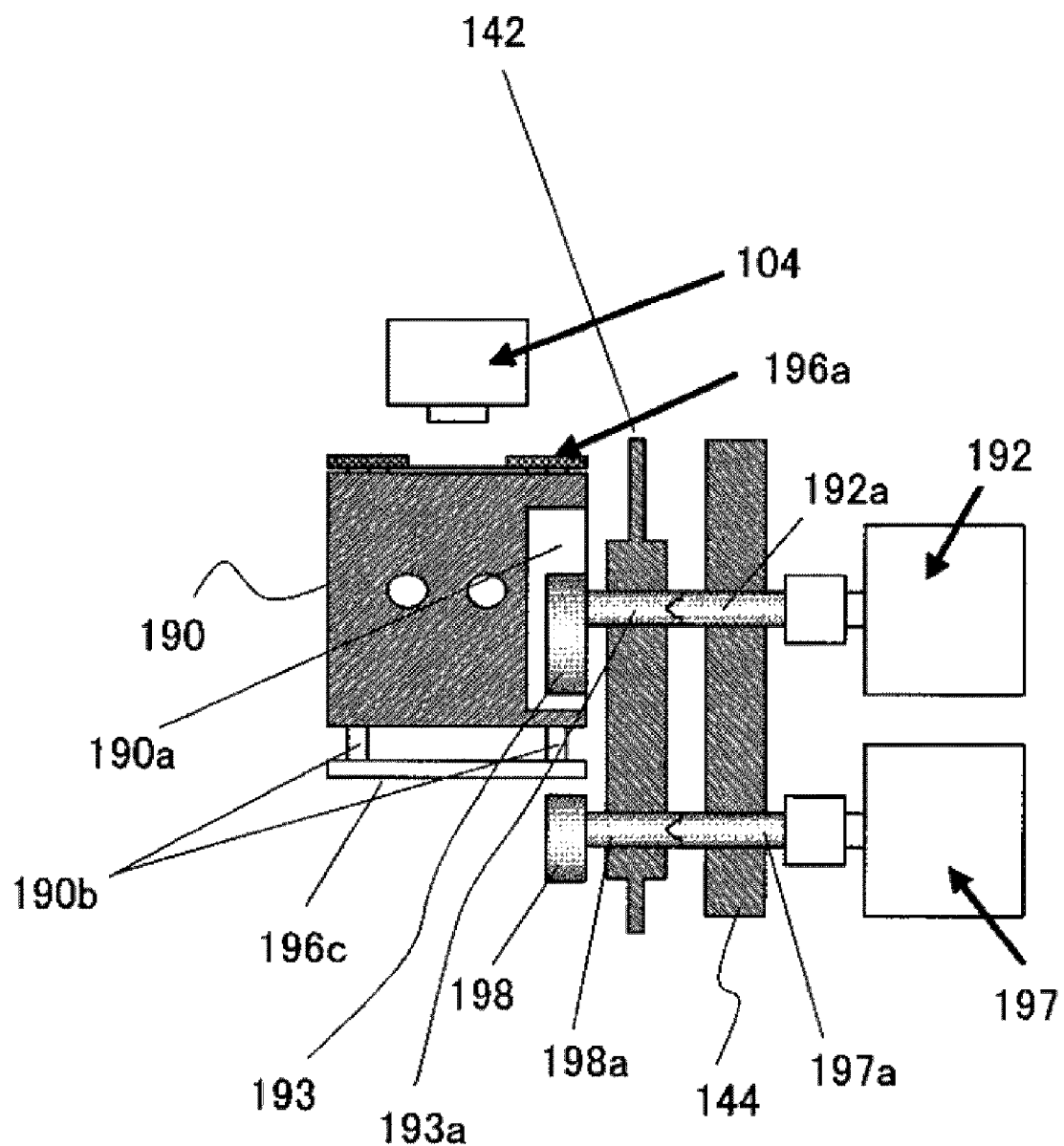
FIG. 11 is a sectional view of the wiping unit shown in FIG. 8.
Figure 12:
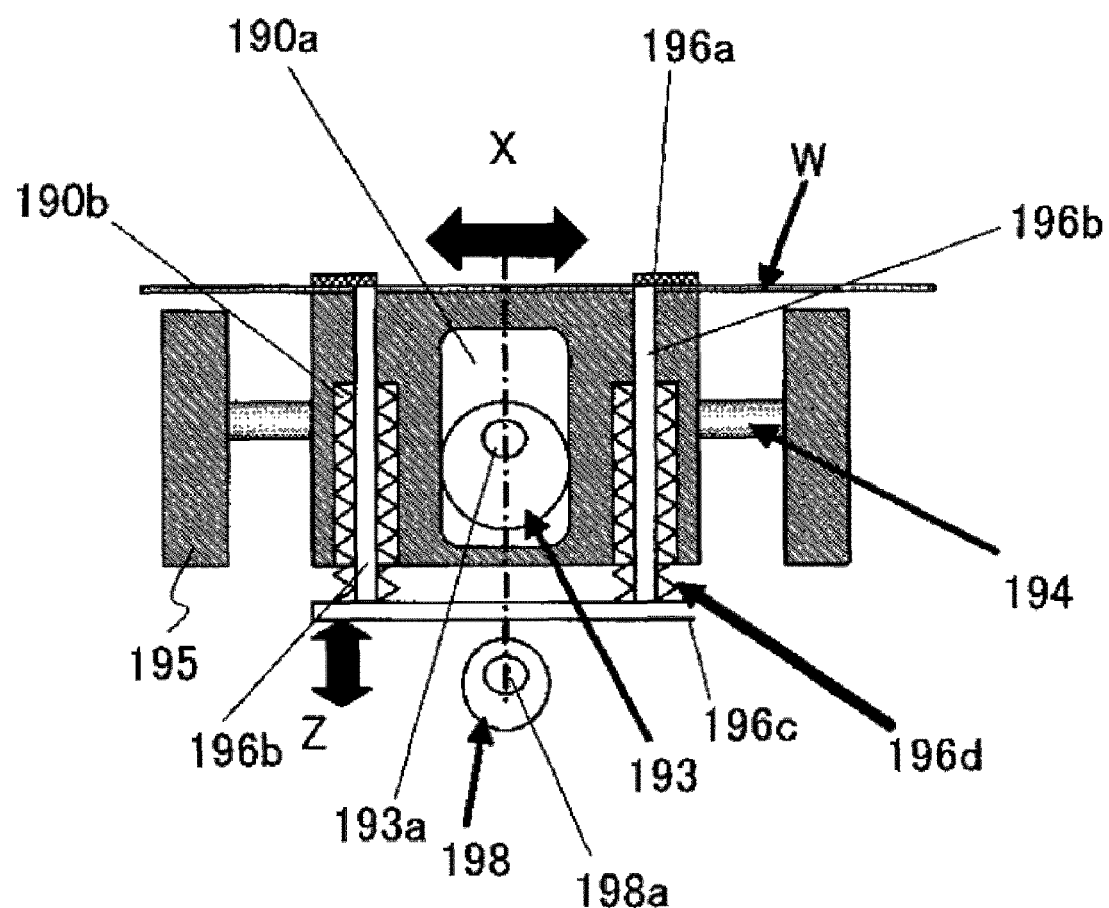
FIG. 12 is a sectional view of the wiping unit shown in FIG. 8.

FIG. 9 is a schematic perspective view near the wiping table 190. FIG. 10 is a schematic plane view near the wiping table 190. FIG. 11 is a schematic sectional view near the wiping table 190. FIG. 12 is a schematic sectional view near the wiping table 190.

The wiping unit 140A includes a swing mechanism, a clamp mechanism, and an unclamp mechanism.

The swing mechanism swings the wiping table 190 in the X direction relative to the cartridge 142. The swing mechanism includes, as shown in FIGS. 9-11, a motor 192 provided on the side of the cartridge support member 144, a decentering cam 193 having a shaft 193a connected to a motor shaft 192a of the motor 192, a pair of guides 194, and a pair of side plates 195.

As shown in FIG. 12, the decentering cam 193 is housed in a cavity 190a in the wiping table 190. The decentering cam 193 approximately contacts the inner wall of the cavity 190a in the X direction. The wiping table 190 is pierced by the two pairs of guides 194, and can move along the guides 194 relative to the guides 194. Both ends of the pair of guides 194 are fixed onto a pair of side plats 195 fixed onto the cartridge 142. When the decentering cam 193 rotates around the shaft 193a, the wiping table 190 swings in the X direction along the guides 194.

The clamp mechanism is a mechanism of clamping the wiping member W so that the wiping member W can follow a swing of the wiping table 190. The clamp mechanism includes, as shown in FIGS. 9-12, a press plate 196a, a pair of support shaft 196b, a bottom plate 196c, and a clamping spring 196d.

The clamping spring 196d is a tension spring: Its one end contacts the ceiling of each cavity 190b formed in the wiping table 190, and its other end contacts the top surface of the bottom plate 196c. Therefore, the clamping spring 196d always applies a vertically downward force to the bottom plate 196c (downwardly in the Z direction). This elastic force is transmitted to the press plate 196a via the support shaft 196b. As a result, the press plate 196a always compresses the wiping member W in the downward direction, and the wiping member follows the swing of the wiping table 190.

Thus, at the wiping time, the clamp mechanism clamps the wiping member W and the head 104 is pressed against the wiping member W. In this state, the swing mechanism simultaneously swings the wiping table 190, the wiping member W, and the clamp mechanism. Since the mass of the object to be swung becomes smaller in comparison with the mass when the cartridge 142 and cartridge support member 144 are entirely swung, the vibrations reduce. In addition, different from FIG. 5, the drive stage 146 does not need to swing, the power consumption can be smaller, and the cost can be reduced.

The unclamp mechanism is a mechanism configured to release clamping by the clamp mechanism in feeding the wiping member W at the end of the wiping etc. The unclamp mechanism includes a motor 197 provided on the side of the cartridge support member 144, and a decentering cam 198 having a shaft 198a connected to a motor shaft 197a of the motor 197. The unclamp mechanism is in the state shown in FIG. 12 at the wiping time. On the other hand, in feeding the wiping member W from the state shown in FIG. 12, the motor 197 rotates the decentering cam 198 by 180° around the shaft 198a. Then, the decentering cam 198 presses the bottom surface of the bottom plate 196c upwardly in the Z direction. As a result, the press plate 196a together with the support shafts 196b displaces upwardly in the Z direction, and separates from the wiping member W for unclamping.

Referring now to FIGS. 13A-15B, a description will be given of a variation of the clamp/unclamp mechanism. This variation utilizes the shutter 148 and the movement mechanism of the shutter 148 for the clamp/unclamp of the wiping member W. The shutter 148 has an opening 148a.

Figures 13A, 13B:
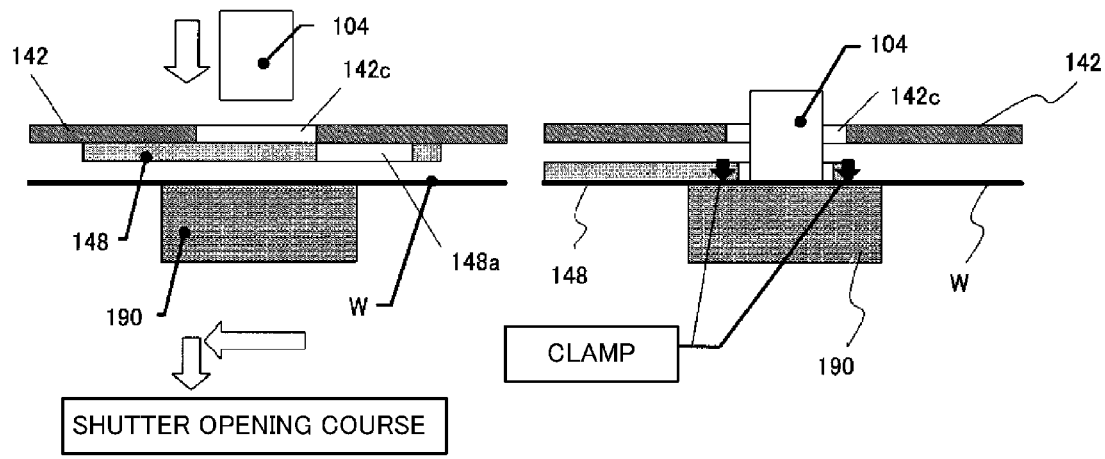
FIG. 13A is a schematically partially sectional view showing an unclamp state of a clamp/unclamp mechanism applicable to the wiping unit shown in FIG. 8.
FIG. 13B is a schematically partially sectional view showing a clamp state of the clamp/unclamp mechanism applicable to the wiping unit shown in FIG. 8.

FIG. 13A is a schematic sectional view showing a relationship among the shutter 148, the wiping member W, and the wiping table 190 in the unclamp state. FIG. 13B is a schematic sectional view showing a relationship among the shutter 148, the wiping member W, and the wiping table 190 in the clamp state. An opening state is given when the opening 148a of the shutter 148 is located just below the opening 142c of the cartridge 142, as shown in FIG. 13B.

Figures 14A, 14B:
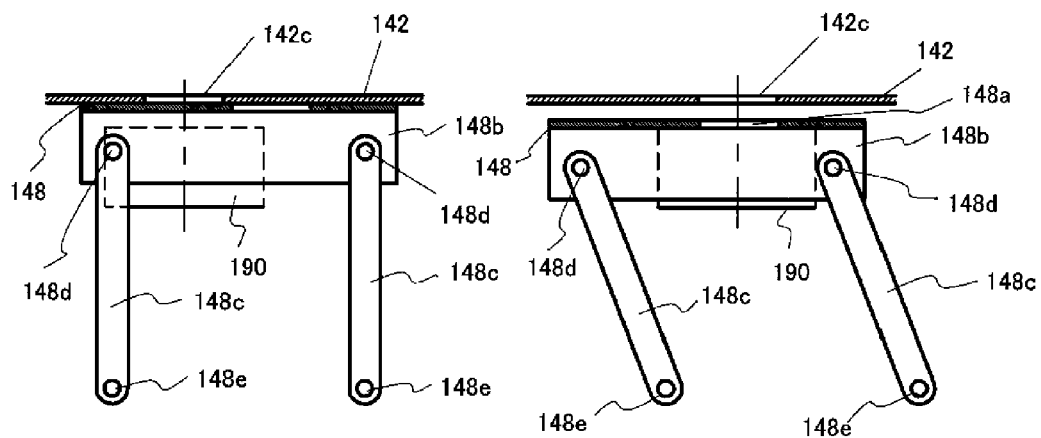
FIGS. 14A and 14B are schematically sectional views showing one example of the clamping/unclamp mechanism shown in FIGS. 13A and 13B.

In FIG. 13A, the shutter 148 is located at an unclamp position and at a close position that closes the opening 142c of the cartridge 142. In FIG. 13B, the shutter 148 is located at a clamp position and at an open position that opens the opening 142c of the cartridge 142. FIGS. 14A and 14B show one example of the clamp/unclamp mechanism configured to move the shutter between the state shown in FIG. 13A and the state shown in FIG. 13B. FIGS. 15A and 15B show another example of the clamp/unclamp mechanism.

The clamp/unclamp mechanism shown in FIGS. 14A and 14B utilizes a linkage, and includes a support plate 148b and a pair of rods 148c.

The support plate 148b is a plate member in this embodiment, and fixed on one side surface of the shutter 148 but may have a box-shaped member that opens at part of the top surface. In addition, it may be a plate member or a pair of support plates 148b may be fixed at both side surfaces of the shutter 148. In this embodiment, the support plate 148b is connected to the shutter 148 on its top surface. Moreover, the opening/closing means (not shown) of the shutter 148 is fixed onto the shutter 148 or the support plate 148b.

A pair of rods 148c have the same shape. When the support plate 148b has a box-shaped member, two pairs of rods are provided for stableness and similarly connected to the back surface of the support plate. One end of the rod 148c is rotatably attached to the support plate 148b via the shaft 148d, and the other end of the rod 148c is rotatably attached to the cartridge 142 or a member connected to the cartridge 142 via the shaft 148e.

FIG. 14A corresponds to FIG. 13A, and FIG. 14B corresponds to FIG. 13B. When the opening/closing means (not shown) of the shutter 148 applies a force to the shutter 148 in the left direction that is the opening direction from the state shown in FIG. 14A, the rod 148c rotates counterclockwise around the shaft 148e and the support plate 148b connected to the rod 148c at the shaft 148d rotates with the shutter 148 accordingly. As a result, the opening state shown in FIG. 14B is obtained.

The clamp/unclamp mechanism shown in FIGS. 15A and 15B utilizes a cam mechanism, and includes a pair of cam grooves 142d provided in the cartridge 142 or a member connected to the cartridge 142, and a support plate 148f having a pair of projections 148g each connected to a corresponding one of the cam grooves 142d.

The support plate 148b is connected to the shutter 148 on its top surface. In addition, the opening/closing means (not shown) of the shutter 148 is fixed onto the shutter 148 or the support plate 148f. A pair of cam grooves 142d have the same shape, and include a horizontal part 142d1 and an arc part 142d2, but may be entirely made of the arc part or curved part. The support plate 148f may be a plate-shaped member or a box-shaped member, similar to the support plate 148b.

FIG. 15A corresponds to FIG. 13A, and FIG. 15B corresponds to FIG. 13B. When the opening/closing means (not shown) of the shutter 148 applies a force to the shutter 148 in the left direction that is the opening direction from the state shown in FIG. 15A, each projection 148g moves along the cam groove 142d. As the projection 148g passes the arc part 142d2, the shutter 148 gradually drops, and the opening state shown in FIG. 15B is finally obtained.

The feed system supplies the wiping member W to the top of the wiping table 149, and rolls up and collects the dirty wiping member W. As a result, when the shutter 148 opens, an exposed part of the wiping member W above the wiping table 149 or 190 changes. The feed system includes the wiping unit controller 141, the motor 150, the take-up reel 152, the guide rollers 156, the connection shafts 158, and a tension application mechanism.

The wiping unit controller 141 adjusts the tension and a feed amount of the wiping member and, if a residual amount becomes small, informs the main controller 102 of that fact. In response, the main controller 102 indicates that fact on the indicator, and displays a message that prompts a user to replace both the take-up reel 152 and the feed reel 154 or the cartridge 142.

A motor shaft of the motor 150 is connected to a connection shaft 158a, and rotates the take-up reel 152 via the connection shaft 158a. The tension and a residual amount of the wiping member W can be detected by monitoring the torque of the motor 150 by using the torque detector 172. In this case, the take-up diameter or the residual amount of the wiping member W and the torque of the motor 150 have a relationship shown in FIG. 16. The abscissa axis denotes the take-up diameter of the wiping member W in the take-up reel 152 or a residual amount of the wiping member W in the feed reel 154. The ordinate axis denotes the torque of the motor 150 connected to the take-up reel 152. The torque of the motor 150 increases as the take-up diameter increases or the residual amount reduces. The exchange timing can be a near-end state before the residual amount becomes 0. Since a rotation amount can be recognized by adding an encoder 170 to the motor 150, a feed amount of the wiping member can be detected.

The take-up reel 152 is a reel configured to roll up the (dirty) wiping member, and has a center shaft 152a. The feed reel 154 is a reel mounted with the clean wiping member and configured to supply it to the wiping table 149, and has a center shaft 154a. The guide rollers 156 support the wiping member W, and determine a feed route of the wiping member W. The guide rollers 156 may be used as part of a detector configured to detect the internal state of the cartridge 142.

The connection shafts 158 are connected to or inserted into the take-up reel 152, the feed reel 154, and the guide rollers 156. The connection shafts 158 include a connection shaft 158a connected to the shaft 152a of the take-up reel 152, and a connection shaft 158b connected to the shaft 154a of the feed reel 154.

The connection shaft 158a is connected with the motor shaft of the motor 150, and the connection shaft 158b is connected with a brake plate 151b of the tension application mechanism, which will be described later. However, when the guide roller 156 has only a function of guiding the wiping member W, the corresponding connection shaft 158 is unnecessary. For this reason, there is no connection shaft 158 corresponding to the guide roller 156 down and to the right of the feed reel 154 shown in FIG. 3. On the other hand, when the guide roller 156 is part of the detection system as described in the state detection system, which will be described later, its output shaft needs to be taken out via the connection shaft 158. For this reason, the connection shafts 158 are connected to four guide rollers 156 around the wiping table 149 shown in FIG. 3.

The wiping member W is wound around the take-up reel 152 and the feed reel 154, for example, as shown in FIG. 5, and only the take-up reel 152 is a driver and the feed reel 154 and other guide rollers 156 are driven members. As the take-up reel 152 rotates in the take-up direction, the wiping member W is fed to the wiping table 149 from the feed reel 154.

Figure 17A:
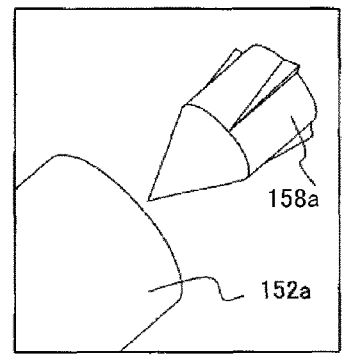
FIG. 17A is an enlarged perspective view near a connection part between a connection shaft and a shaft of the take-up reel.
Figure 17B:
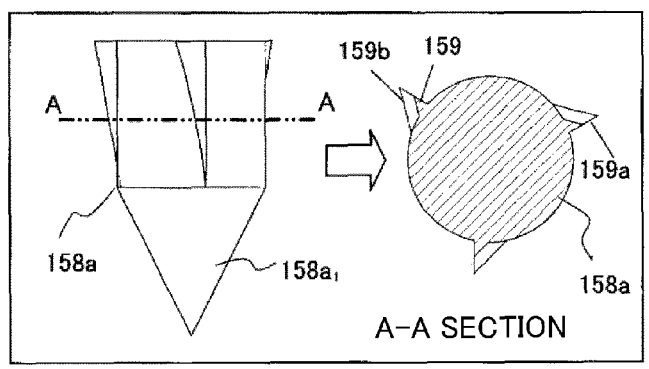
FIG. 17B is a plane view and an A-A sectional view of the connection shaft shown in FIG. 17A.
Figures 17C, 17D:
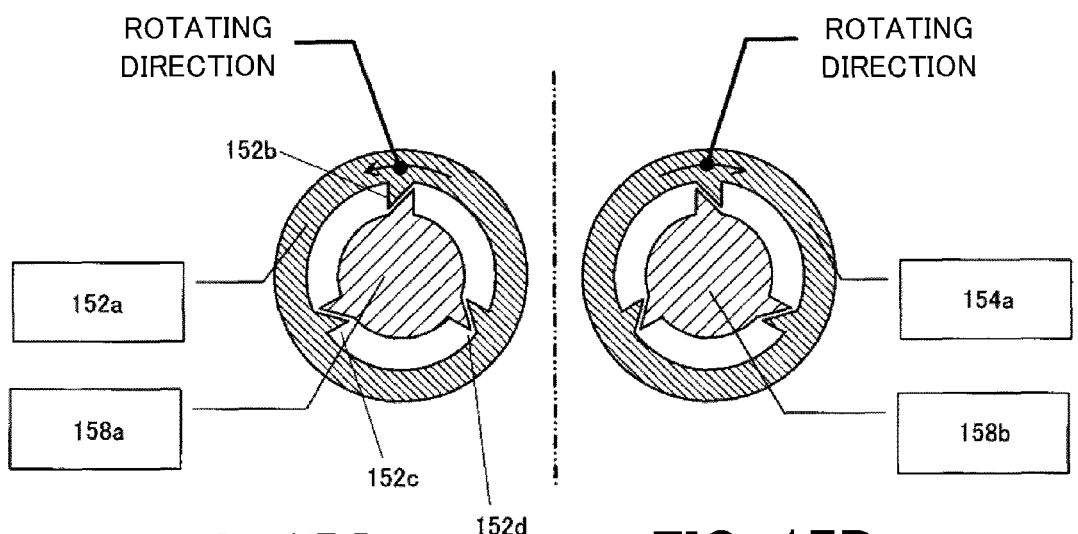
FIG. 17C is a sectional view of an engagement state of both shafts shown in FIG. 17A.
FIG. 17D is a sectional view of the connection shaft inserted into the shaft of the feed reel.

Referring now to FIGS. 17A-17D, a description will be given of structures of the connection shaft 158a, the shaft 152a, the connection shaft 158b, and the shaft 154a. FIG. 17A is an enlarged perspective view near a connection part between the connection shaft 158a and the shaft 152a. FIG. 17B is a plane view and an A-A sectional view of the connection shaft 158a. FIG. 17C is a sectional view of the connecting shaft 158a inserted into the shaft 152a. FIG. 17D is a sectional view of the connection shaft 158b inserted into the shaft 154a.

The shaft 152a has a hollow cylindrical shape, as shown in FIG. 17C, and includes three projections 152b arranged in the cylindrical direction at intervals of 120°, although the number of projections 152b and the interval between the projections 152b are not limited.

The projection 152b has a triangular prism shape, and bevel surfaces 152c and 152d, which extend obliquely to a direction perpendicular to the paper plane. The bevel surface 152c surface-contacts a bevel surface 159a of the projection 159 of the connection shaft 158a. The bevel surface 152d surface-contacts a bevel surface 159b of the projection 159 of the connection shaft 158a, and has an inclination angle relative to a tangential direction smaller than the bevel surface 152c. A borderline between the bevel surface 152d and the shaft 152a inclines relative to a generating line of the hollow cylinder.

The connection shaft 158a has a shape made by connecting a conical part 158a1 and a cylindrical part 158a2, as shown in FIGS. 17A-17C. The cylindrical part 158a2 has three projections 159 arranged in the circumferential direction at intervals of 120°, although the number of projections 159 and the interval between the projections 159 are not limited.

The projection 159 has a triangular prism shape, similar to the projection 152b, and includes bevel surfaces 159a and 159b. The bevel surface 159a surface-contacts the bevel surface 152c of the projection 152b of the shaft 152a. The bevel surface 159d surface-contacts the bevel surface 152d of the projection 152b of the connection shaft 152a, and has an inclination angle smaller than the bevel surface 159a. As shown in the A-A sectional view in FIG. 17B, a borderline between the bevel surface 159b and the cylindrical part 158a2 inclines relative to a generating line of the cylinder part 158a2.

In connecting the cartridge 142 to the cartridge support member 144 or in attaching the take-up reel 152 to the cartridge 142, the connection between the shafts 152a and the 158b is smooth. For example, if a gear is formed on a surface of the connection shaft 158a and a corresponding gear is formed on an internal surface of the shaft 152a, the insertion becomes difficult or unable if their phases do not match at the insertion time. In particular, this is even true when the insertion causes an increase of the tension of the wiping member W.

In addition, similar to the connection shaft 158a, the connection shaft 158b is fixed onto the brake plate 151b, which will be described later, and does not rotate because the load M is applied to the connection shaft 158b by the tension adjustment mechanism 151. Therefore, the connection shaft 158b and the shaft 154a suffer from similar problems to that for the connection shaft 158a and the shaft 152a.

As shown in FIGS. 17A to 17C, in the connection parts, the bevel surfaces 152c and 152d have different shapes and the bevel surfaces 159a and 159b have different shapes, allowing the take-up reel 152 to rotate in a rotating direction at the insertion time, as shown in FIG. 17C. When this rotation direction is set to a direction in which the tension applied to the wiping member W becomes smaller or a counterclockwise direction shown in FIG. 5, no problem occurs such as the wiping member W is cut due to an excessive tension when the shaft 152a is connected to the connection shaft 158a. As a result, attachments of the cartridge 142 and the take-up reel 152 become easier.

Referring now to FIG. 5, as the take-up reel 152 rotates clockwise, it rolls up the wiping member W; as the take-up reel 152 rotates counterclockwise, it slacks the tension of the wiping member W. On the other hand, as the feed reel 154 rotates counterclockwise, it strengthens the tension of the wiping member W; as the feed reel 154 rotates clockwise, it feeds the wiping member W. Since the slacking directions of the wiping member W are thus opposite between the take-up reel 152 and the feed reel 154, it is necessary to form the connection part between the feed reel 154 and the connection shaft 158b, in a direction opposite to that for the take-up reel 152. FIG. 17D shows this structure.

On the other hand, when the motor 150 is rotated, the bevel surface 152c surface-contacts the bevel surface 159a and the driving force of the motor is transmitted to the take-up reel 152 via the connection shaft 158a and the shaft 152a.

The structure of the connection part is not limited. For example, a connection between the shafts 152a and 158a may use a coupling or another connection means.

Figure 18:
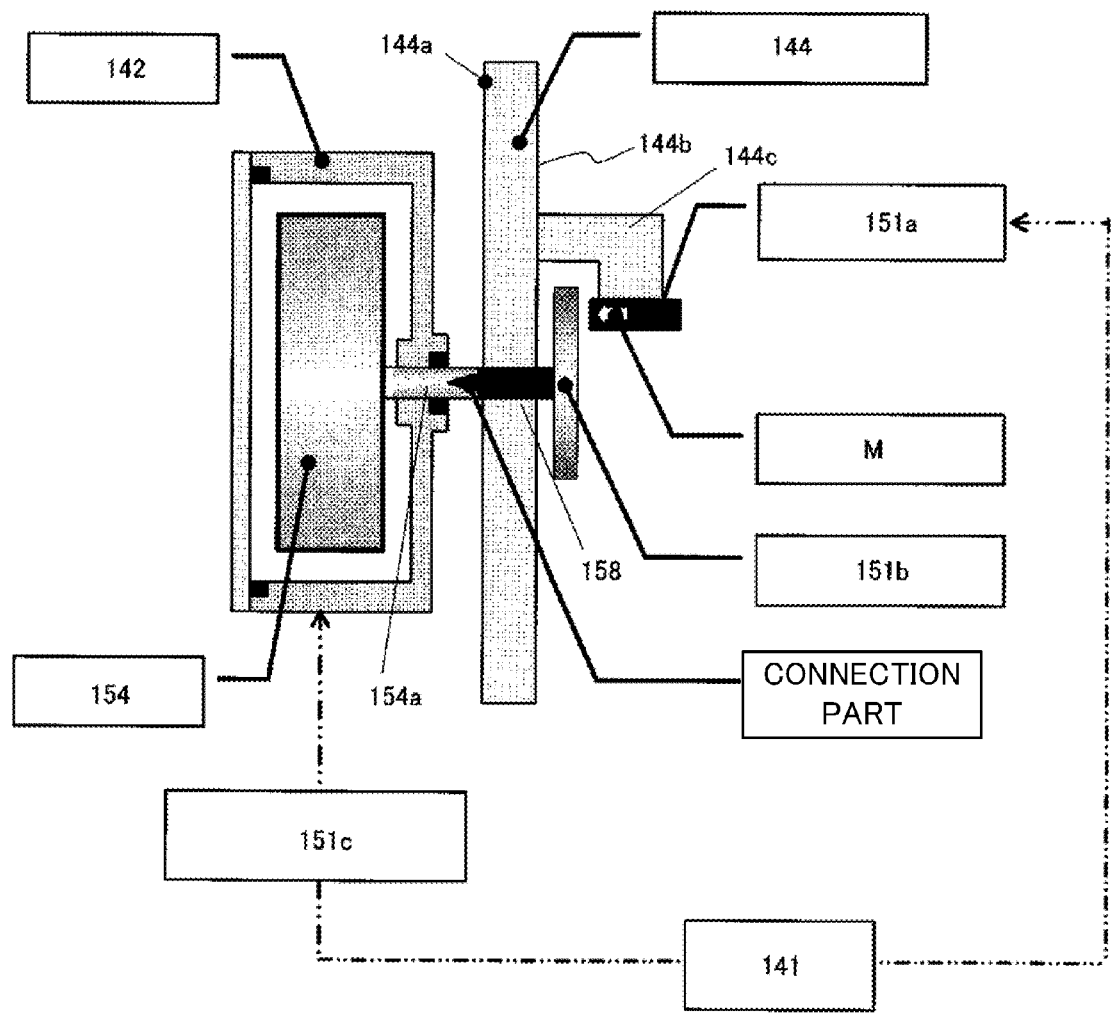
FIG. 18 is a schematic sectional view of a tension application mechanism of the wiping unit shown in FIG. 3.

The tension application mechanism is a mechanism configured to apply a predetermined tension to the wiping member W. When no tension is applied, a slack occurs in the wiping member W due to the friction between the wiping member W and the tool surface 105. In addition, the slack would make an infiltration of the solvent uneven. Then, average wiping of the tool surface 105 is unavailable, the life of the head 104 shortens, and its exchange frequency increases. The tension application mechanism includes, as shown in FIG. 18, a tension adjustment mechanism 151a and a brake plate 151b.

The tension adjustment mechanism 151a is mounted on a support member 144c having an L-shaped section provided on the surface 144b of the cartridge support member 144, and applies the load M onto the brake plate 151b. This load M provides the tension. The tension adjustment mechanism 151a is made, for example, of an air cylinder.

The brake plate 151b is a disk provided on a surface 144b of the cartridge support member 144, and a connection shaft 158 as one center axis projects to the surface 144a of the cartridge support member 144. The connection shaft 158 is connected to the shaft 154a of the feed reel 154. In FIG. 5, as the take-up reel 152 rotates clockwise, the feed reel 154 also rotates clockwise but the brake plate 151b applies the resistance smaller than the rotating force of the take-up reel 152 in the direction in which the feed reel 154 rotates. As a result, the tension corresponding to a difference between the rotating force of the take-up reel 152 and the resistance of the brake plate 151b can be applied to the wiping member W.

The tension application mechanism can eliminate the slack of the wiping member W at the wiping time, stabilize the wipe operation, surely wipe out the underfill UF, and extend the life of the head 104. In rolling up the wiping member W, a twist or slack of the wiping member W is restrained, and wiping can be made stable.

In order to apply a constant tension to the wiping member W irrespective of a diameter of the wiping member W of the feed reel 154, a residual amount detector 151c may be provided and the wiping unit controller 141 may adjust the load M in accordance with a change of the diameter. The tension may be adjusted by the controller other than the wiping unit controller 141. The residual amount detector 151c can use the torque detector 172 and a cantilever 176, which will be described later.

Figure 19:
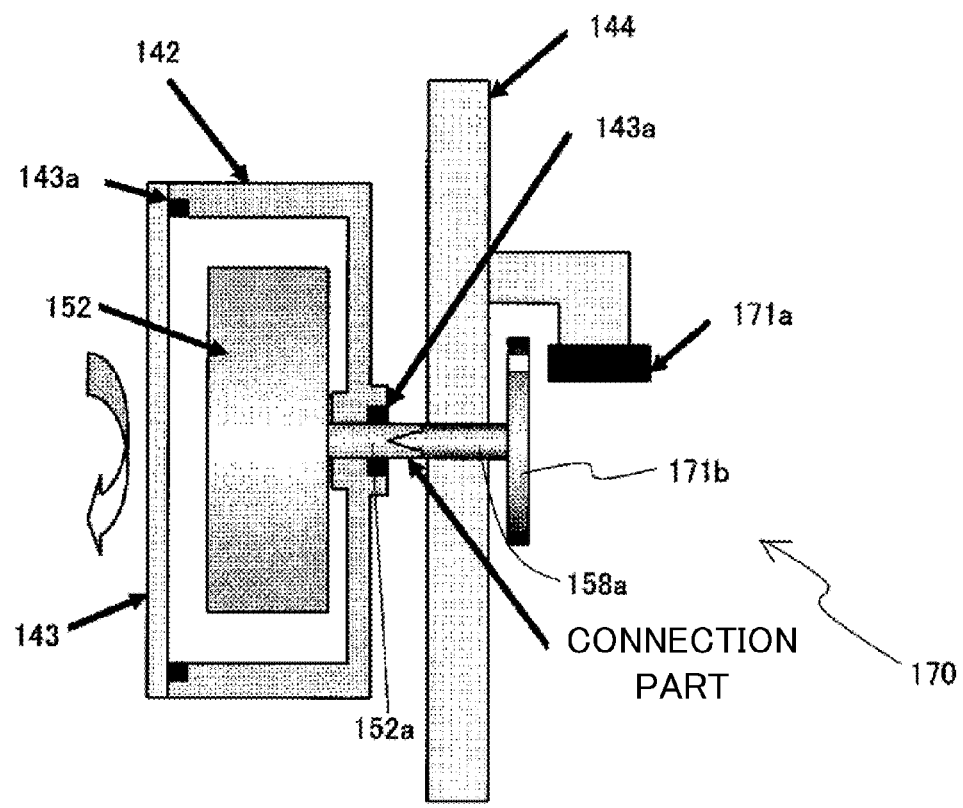
FIG. 19 is a schematic sectional view showing one example of a state detection system of the wiping unit shown in FIG. 3.
Figure 20:
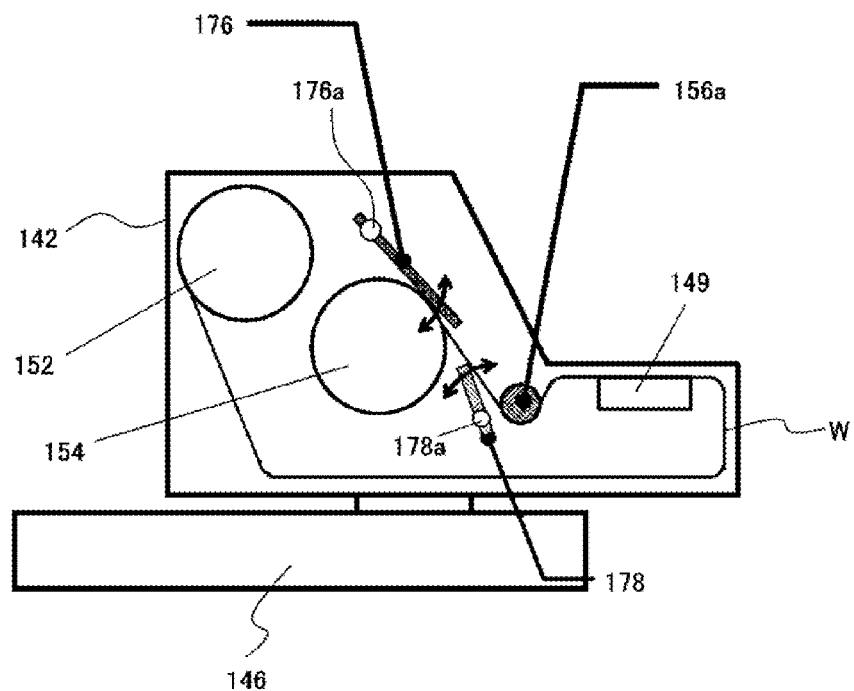
FIG. 20 is a schematic sectional view showing another example of a state detection system of the wiping unit shown in FIG. 3.

As shown in FIGS. 19-20, the state detection system detects the internal state (such as an end, a feed amount, and a residual amount of the wiping member) of the cartridge 142 having an airtight structure from the outside. The state detection system includes an output shaft that associates with the operation of the operating part of the cartridge 142, a connection part that connects the output shaft to an external output part, the external output part provided in the cartridge support member 144, and a detector provided in the cartridge support member 144 and configured to detect a change of the external output part.

For the airtight structure of the cartridge 142, the cartridge 142 and the cover 143 are sealed by a seal 143a. The operating part is, for example, the take-up reel 152. The hollow shaft (output shaft) 152a of the take-up reel 152 is connected to the motor shaft of the motor 150 via the connection shaft 158a. The connection part is not limited, such as a mechanical engagement using a convex and a concave or magnetic coupling. The detector comprised of a rotary encoder 170 includes an optical sensor 171a and a disc 171b for detecting a rotational angle. In FIG. 19, the motor 150 is omitted.

The airtight seal 143a is also provided between shaft 152a and the cartridge 142, and maintains the cartridge 142 airtight. The encoder 170 may use any structure known in the art, such as an increment type or an absolute type, and a detailed description thereof will be omitted. The state detection system shown in FIG. 19 can provide a feed amount of the wiping member corresponding to the rotation angle of the motor 150. The state detection system comprised of the torque detector 172 can detect an end or a residual amount of the wiping member.

Of course, the state detection system is not limited to the encoder 170 or the torque detector 172. FIG. 20 uses the guide roller 156a, the cantilever 176, and the lever 178 for the state detection system.

Figure 21:
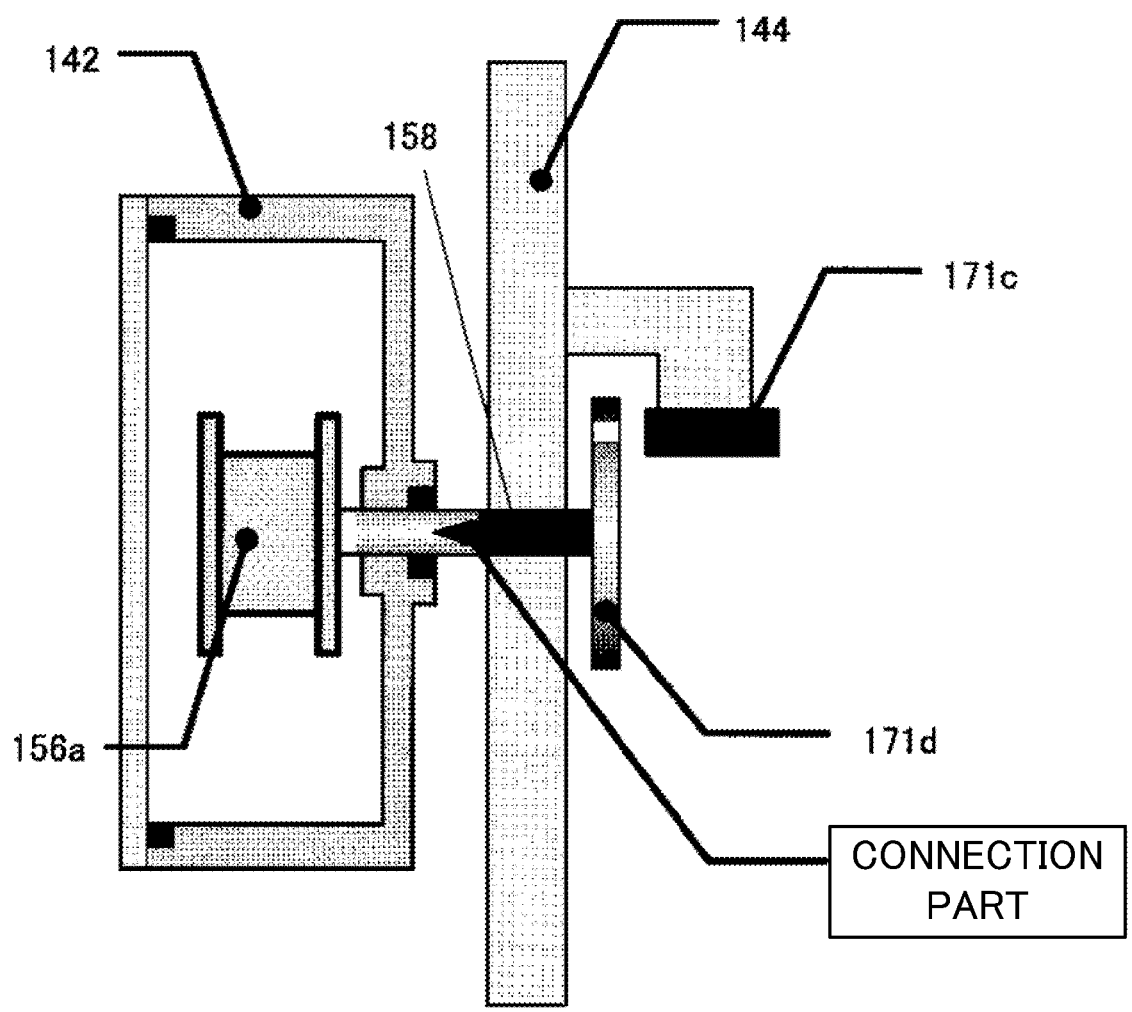
FIG. 21 is a schematic sectional view of the state detection system that uses a guide roller shown in FIG. 19.

The guide roller 156a rotates with a movement of the wiping member W, and a feed amount of the wiping member W can be detected by a mechanism similar to that shown in FIG. 19, when the guide roller 156a is regarded as the take-up reel 152 shown in FIG. 19. FIG. 21 shows this example. FIG. 21 is a sectional view of the state detection system corresponding to FIG. 19. An optical sensor 171c and a disc 171d for detecting the rotation angle correspond to the optical sensor 171a and the disc 171b for detecting the rotation angle, forming a rotary encoder. Thereby, a feed amount of the wiping member W can be maintained constant, and the cost and the exchange frequency can be saved through maximum utilization.

Similarly, the cantilever 176 is configured to rotate around the shaft 176a; it displaces to the counterclockwise side when there is a large residual amount of the wiping member W, and displaces to the clockwise side when the residual amount becomes small. When the shaft 176a is regarded as the take-up reel 152 shown in FIG. 19, a residual amount of the wiping member W can be detected by a mechanism similar to that shown in FIG. 19. The lever 178 is configured to rotate around the shaft 178a, and rotates clockwise in FIG. 19 when the wiping member W runs out. When the shaft 178a is regarded as the take-up reel 152 shown in FIG. 19, an end of the wiping member W can be detected by a mechanism similar to that shown in FIG. 19.

Thus, the state detection system maintains the inside of the cartridge 142 airtight, and prevents a leakage of any volatile solution to the outside, providing a waterproof and explosion-proof structure. In addition, since a common sensor and a common actuator are used for all cartridges 142 rather than providing a sensor and an actuator for each cartridge 142, a variety of effects are obtained, including the cost reduction, a simpler structure, an easy exchange of the wiping member, easy maintenance and exchange of the cartridge 142, and the reduced number of operations.

Figure 22:
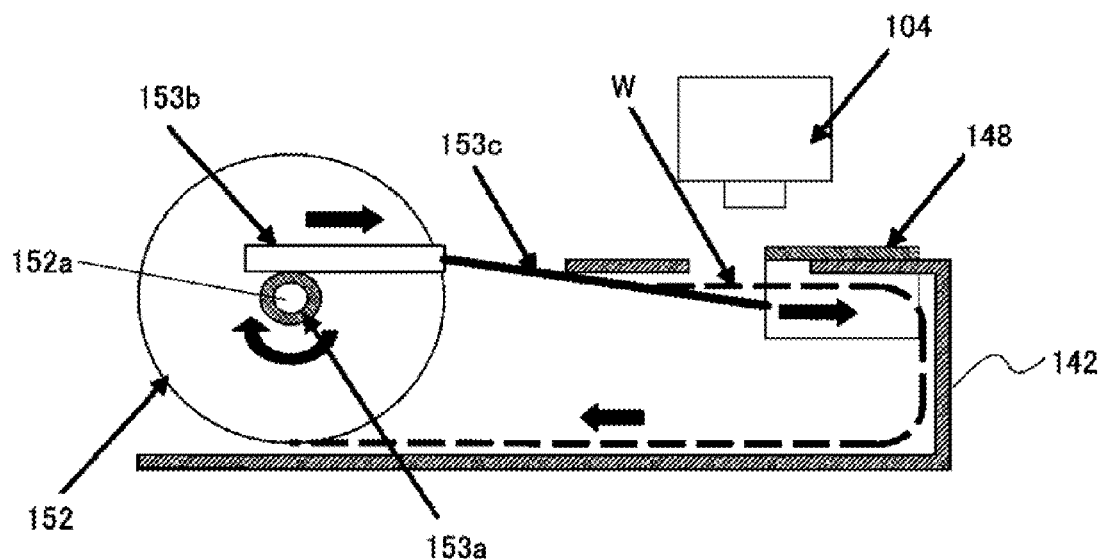
FIG. 22 is a schematically partially sectional view of a variation of a feed system shown in FIG. 3.

Referring to FIG. 22, a description will be given of a variation of the feed system. FIG. 22 is a schematic sectional view showing the variation of the feed system. The feed system shown in FIG. 22 is a mechanism of drawing the wiping member W in association with opening of the shutter 148. Therefore, the take-up motor is also unnecessary.

The shaft 152a of the take-up reel 152 is engaged with a one-way clutch 153a, the one-way clutch 153a is engaged with a pinion, and the pinion is engaged with a rack. The shutter 148 is connected to the rack via a connection rod 153c.

When the shutter 148 opens in the arrow direction, the rack and the pinion 153b move in the arrow direction via the connection rod 153c, and rotate the shaft 152a clockwise via the one-way clutch 153a. As a result, the take-up reel 152 rotates, and the wiping member W is fed.

On the other hand, even when the shutter 148 closes, the one-way clutch 153a does not rotate the shaft 152a. Thus, when the feed system is configured to feed the wiping member W in association with opening of the shutter 148, the take-up mechanism of the wiping member W does not need a motor and the wiping unit becomes less expensive, smaller, and lighter.

Turning back to FIGS. 1 and 3, the solvent supply system serves to supply the solvent configured to powder the underfill UF, to the exposed part of the wiping member W on the wiping table 149, and includes a wiping unit controller 141, a solvent supply unit controller 160, a solvent supply unit 162, a joint 164, and a tube 166.

The underfill UF is generally epoxy resin, which is a viscose liquid and is unlikely to be absorbed in the cloth, etc. The solvent contains, for example, pure water or alcohol. When the underfill UF is powdered and the wiping member made of the cloth, it is likely to come into apertures in the fiber.

The solvent supply unit 162 stores the solvent and supplies it to the wiping member via the joint 164 and the tube 166 connected to the joint 164. A solvent supply amount and the supply timing of the solvent supply unit 162 are controlled by the solvent supply unit controller 160. The solvent supply unit controller 160 is controlled by the wiping unit controller 141.

The ultrasonic bonding apparatus 100 further includes a mounting means (such as a robot arm) of the substrate B onto a stage of the alignment mechanism 136, and a mounting means of the chip C onto the tool surface 105 of the head 104. However, these mounting means are omitted in FIG. 1.

The timing control system serves to control the wiping timing, and includes a wiping unit controller 141 and a dirt state detector.

The wiping unit controller 141 determines, based on a detection result of the dirt state detector, whether the tool surface 105 needs wiping. Instead of the wiping unit controller 141, the main controller 102 or another controller connected to the main controller 102 (which will be sometimes referred to as a "controller" collectively) may be used.

The dirt state detector detects a dirt state of the tool surface 105, and includes one of the image pickup system, an ultrasonic amplitude variation detection system, an impedance variation detection system, a counter, and a clock. One of the ultrasonic amplitude variation detection system and the impedance variation detection system is sufficient, and the image pickup system is used instead of or together with one of them.

The image pickup system take an image of the back surface of the chip C mounted onto the substrate B when the substrate B is exported, detects the dirt state, and includes an image pickup unit 180, a movement mechanism 182, and an image processor 184. The image pickup unit 180 includes a camera that has a field that can take an image of the back surface of the chip C. The movement mechanism 182 and the image processor 184 are similar to the movement mechanism 133 and the image process 134, and a detailed description thereof will be omitted.

The ultrasonic amplitude variation detection system detects a variation of the ultrasonic amplitude, and includes the ultrasonic generator 120. The impedance variation detection system detects a variation of the oscillation impedance, and includes the ultrasonic generator 120. The oscillation impedance and the amplitude lower, as the underfill UF adheres to the tool surface 105 or the thickness of the underfill UF increases.

Figure 23:
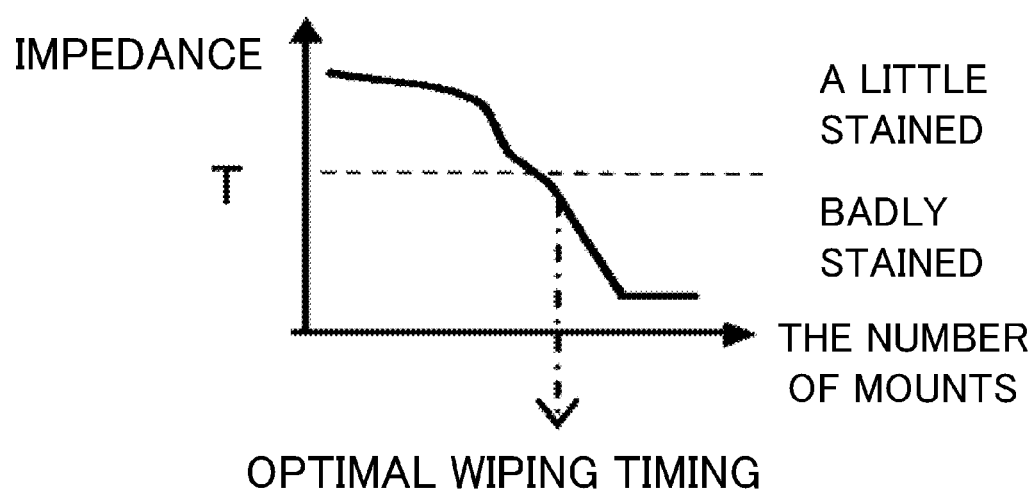
FIG. 23 is a graph showing a relationship between the number of mounts of the chip C and the oscillation impedance of the ultrasonic wave.

When the impedance is a determinant, the controller previously obtains a relationship between the impedance and the number of mounts of the chip C, as shown in FIG. 23. The controller determines, based on a value of the impedance obtained from the ultrasonic generator 120, whether the dirt is bad or whether wiping is necessary. In case of the amplitude, the controller also uses a similar graph for a determination. In case of the image of the back surface of the chip, the controller previously obtains a threshold of the area of the underfill UF that adheres to the back surface of the chip, and determines that it is dirty or wiping is necessary when detecting the area of the underfill UF larger than the threshold.

The counter counts the number of chips C mounted without wiping. The clock measures a mounting time period of the chip C mounted without wiping.

Figure 24:
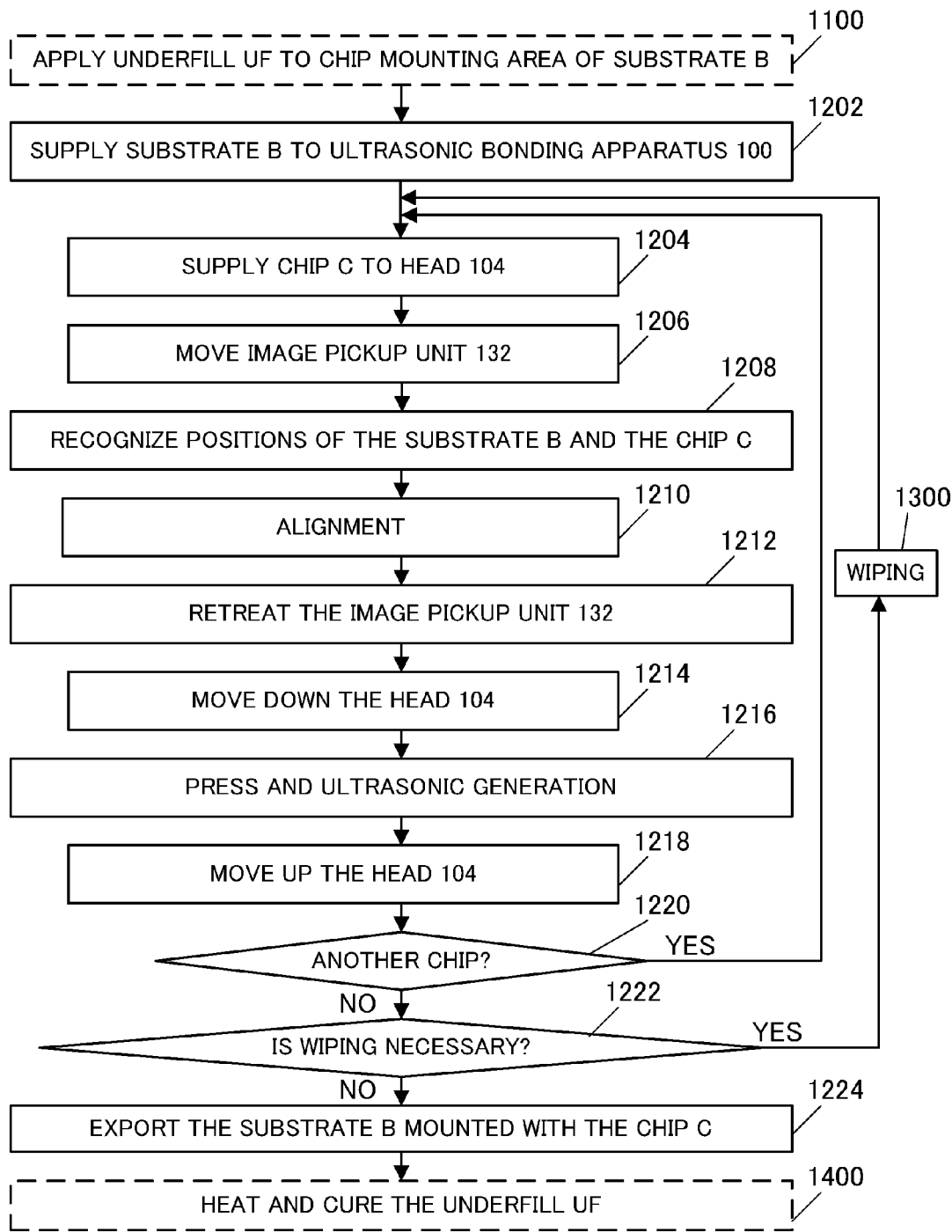
FIG. 24 is a flowchart for explaining an operation of the ultrasonic bonding apparatus shown in FIG. 1.

Referring now to FIG. 24, a description will be given of an operation of the ultrasonic bonding apparatus 100. FIG. 24 is a flowchart for explaining an operation of the ultrasonic bonding apparatus 100. Initially, as a pretreatment, the underfill UF is applied to the chip mounting area of the substrate B by using a dispenser (not shown) (step 1100). The underfill UF is applied outside of the ultrasonic bonding apparatus 100, and shown by a broken line in FIG. 24.

In the ultrasonic bonding apparatus 100, the substrate B is supplied to and mounted onto a three-dimensional stage of the alignment mechanism 136 by a robot arm (not shown) (step 1202). Next, the chip C is mounted onto the tool surface 105 of the head 104 by using a robot arm (not shown) (step 1204). Next, the movement mechanism controller 135 controls the movement mechanism 133 to move the image pickup unit 132 to the image pickup position (step 1206). Next, the positions of the substrate B and the chip C are recognized based on an image processing result by the image processor 134 by recognizing their alignment marks (step 1208).

Next, the alignment mechanism controller 131 controls the alignment mechanism 136 to move the substrate B so that both alignment marks can have a predetermined positional relationship, thereby providing an alignment between the chip C and the chip mounting area of the substrate B (step 1210). Next, the movement mechanism controller 135 controls the movement mechanism 133 to retreat the image pickup unit 132 (step 1212). Next, the press controller 110 controls the Z stage of the press mechanism 112 to move down the head 104 (step 1214).

After the chip C contacts the surface of the chip mounting area to which the underfill UF has been applied, the press controller 110 controls the Z stage of the press mechanism 112 to apply a predetermined pressure to the chip C. In addition, the press controller 110 controls the ultrasonic generator 120 to apply the predetermined ultrasonic wave to the transducer 122 (step 1216). As a result, the bumps N on the chip C are ultrasonically bonded with the pads of the substrate B. Next, the press controller 110 controls the Z stage of the press mechanism 112 to move up the head 104 (step 1218).

Next, the controller determines whether there is another chip to be mounted (step 1220). When the controller determines that there is no other chips to be mounted (step 1220), the controller determines whether tool surface 105 needs wiping, based on a detection result of the dirt state detector (step 1222). In other words, the controller compares the area of the underfill UF on the back surface of the chip photographed by the image pickup system, with the threshold stored in the memory. If the controller determines that the area is larger than the threshold, the controller determines that wiping is necessary. Alternatively, the controller compares the oscillation impedance value detected by the ultrasonic generator 120 with the threshold T of the broken line in the graph shown in FIG. 5. If the controller determines that the value is higher than the threshold, the controller determines that wiping is necessary. Alternatively, the controller compares the amplitude value detected by the ultrasonic generator 120 with the previously stored threshold of the graph. If the controller determines that the value is higher than the threshold, the controller determines that wiping is necessary. Alternatively, the controller obtains and compares with a threshold a value of the counter configured to count the number of chips C mounted without wiping. If the controller determines that the value is higher than the threshold, the controller determines that wiping is necessary. Alternatively, the controller obtains and compares with a threshold a value of the clock configured to measure a mounting time period of the chip C without wiping. If the controller determines that the value is higher than the threshold, the controller determines that wiping is necessary.

The controller exports, when determining that no wiping is necessary (step 1222), the substrate B mounted with the chip C by using the robot arm (not shown) from the ultrasonic bonding apparatus 100 (step 1224).

Next, as a post-treatment, the substrate B mounted with the chip C is housed in a heater (not shown) so as to heat the substrate B to cure the underfill UF. As a consequence, the electronic device 10 shown in FIG. 2 is manufactured (step 1400).

On the other hand, when the controller determines that there is another chip to be mounted (step 1220), the flow returns to the step 1204.

In addition, when the controller determines that wiping is necessary (step 1222), the controller allows the wiping unit 140 to wipe out the underfill UF (step 1300). Thereafter, the flow returns to the step 1204.

Figure 25:
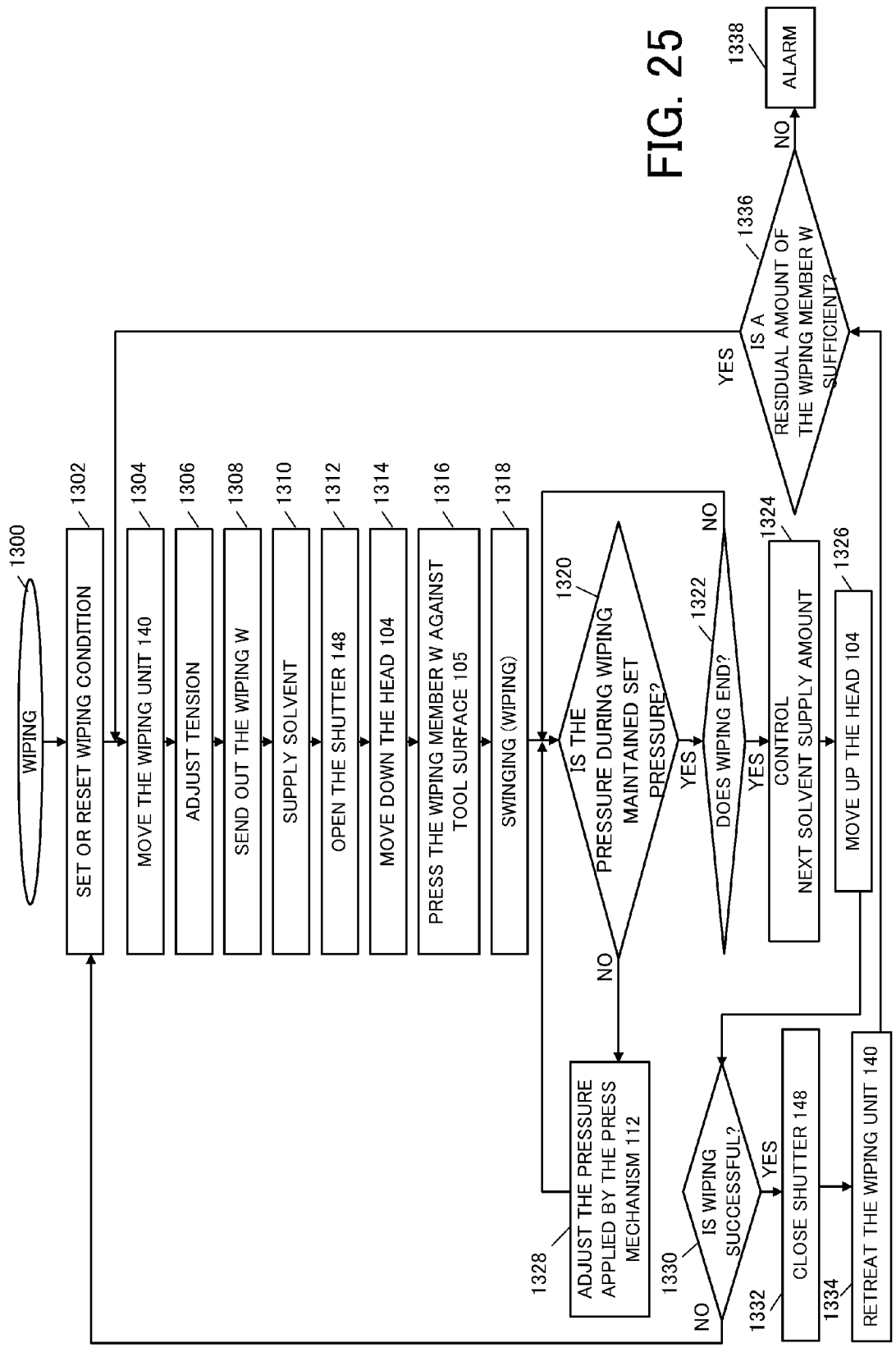
FIG. 25 is a flowchart for explaining details of the step 1300 shown in FIG. 24.

Referring now to FIG. 25, a description will be given of details of the step 1300. FIG. 25 is a flowchart for explaining details of the step 1300.

Initially, a wiping condition is set or reset in the memory of the main controller 102 or the wiping unit controller 141 or another controller (simply referred to as a "controller" hereinafter) (step 1302). The initial setting is made by a user from the input part but the resetting is automatically performed by the controller. The wiping condition determines the wipe operation performed by the wiping unit 140. The wiping condition contains a wiping amplitude, a wiping time period, a solvent supply amount, and a pressure.

The wiping amplitude is an amplitude or width by which the drive stage 146 reciprocates or swings the cartridge 142 or the wiping table 190 in the X direction. The wiping time period is a time period used for the drive stage 146 to reciprocate or swing the cartridge 142 or the wiping table 190 in the X direction. The solvent supply amount is a supply amount of the solvent supplied by the solvent supply unit 162. The pressure is a pressure between the tool surface 105 and the wiping member W on the wiping table 149 applied by the press mechanism 112.

Next, the wiping unit controller 141 controls the drive stage 146 to move the wiping unit 140 (step 1304). Next, the wiping unit controller 141 controls the tension application mechanism to apply the tension to the wiping member W (step 1306).

Next, the wiping unit controller 141 controls the motor 150 to supply the wiping member W from the feed reel 154 to the top of the wiping table 149 (step 1308). Next, the solvent supply unit controller 160 controls the solvent supply unit 162 to supply the solvent to the exposed part of the wiping member W which exposes above the wiping table 149 via the joint 164 and the tube 166 (step 1310). Next, the wiping unit controller 141 opens the shutter 148 (step 1312). Next, the press controller 110 controls the Z stage of the press mechanism 112 to move down the head 104 (step 1314).

After the chip C mounting area and its surrounding area on the tool surface 105 contacts the wiping member W on the wiping table 149, the press controller 110 controls the Z stage of the press mechanism 112 to apply the predetermined pressure to the tool surface 105 (step 1316). Next, the wiping unit controller 141 controls the drive stage 146 to swing the wiping unit 140 or the wiping table 190 in the X direction for wiping of the tool surface 105 (step 1318).

Figure 26A:
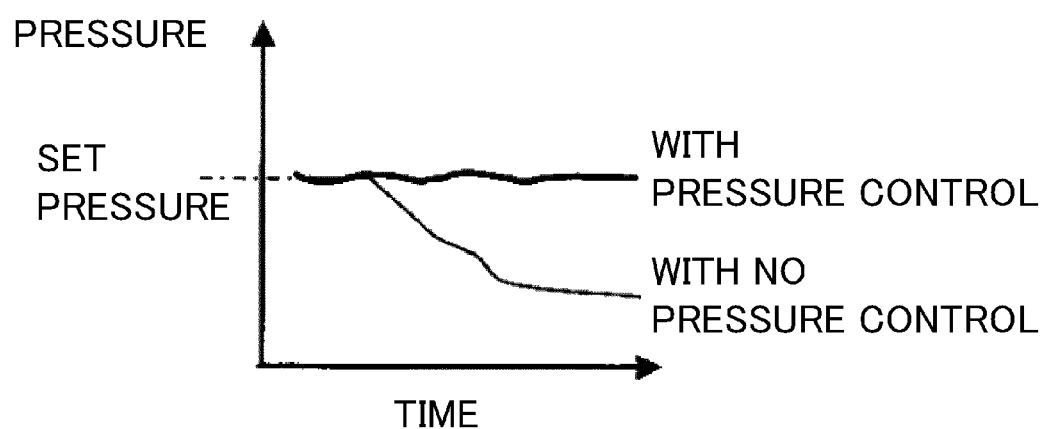
FIG. 26A is a graph that compares the pressure applied to the wiping member whether or not there is a pressure control of the step 1328 shown in FIG. 25.

The pressure is controlled during wiping. When the press mechanism 112 continues to apply the set pressure, the wiping member W is gradually crushed during wiping. As a result, as shown in FIG. 26A, the actual pressure gradually decreases from the set pressure (see a graph of "with no pressure control"). Therefore, it is necessary to adjust the pressure applied by the press mechanism 112 so that the pressure applied to the wiping member W can be the set pressure (see a graph of "with pressure control" in FIG. 26A).

Accordingly, the controller determines, based on the detection result of the load sensor 114, whether the pressure during wiping is the set pressure (step 1320). When the controller determines that the actual pressure is the set pressure in the wiping (step 1320), the controller determines whether or not wiping ends (step 1322). The load sensor 114 may be provided to the wiping unit 140.

Figure 26B:
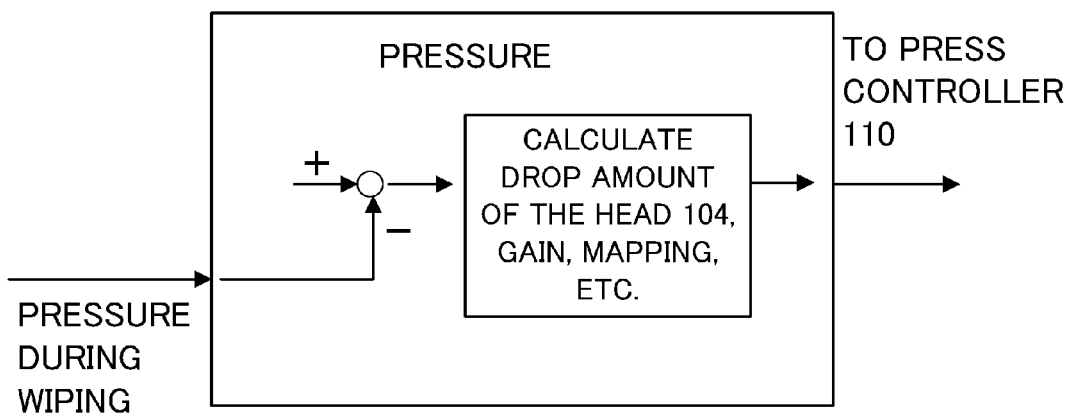
FIG. 26B is a block diagram of the pressure control.

When the controller determines that wiping is still continuing (step 1322), the flow returns to the step 1320. On the other hand, when the controller determines that the pressure during wiping is not the set load (step 1320), the controller provides a pressure control shown in FIG. 26B, and informs the press controller 110 of the result. In response, the press controller 110 adjusts (usually gradually increases) the pressure by the press mechanism 112, and maintains the set pressure (step 1328). Thereafter, the flow returns to the step 1320.

When the controller determines that wiping ends (step 1322), the controller controls the next solvent supply amount (step 1324). In other words, as described above, the wiping member W is gradually crushed during wiping, and consequently the solvent absorbing power lowers. As a solvent supply amount is excessively large, the liquid leakage occurs; as a solvent supply amount is excessively small, the wiping performance lowers. Therefore, a solvent supply amount needs to be controlled properly.

Accordingly, the controller stores a variation (deviation) of the pressure in the step 1328, estimates a crush amount of the wiping member W for the same surface in the next wiping based on the stored information, and returns to the step 1302 to reset the solvent supply amount by the solvent supply unit 162 in the step 1310. According to this control, a solvent supply amount is reduced as a crush amount of the wiping member W becomes larger.

Next, the press controller 110 controls the Z stage of the press mechanism 112 to move up the head 104 (step 1326). Next, the controller determines whether the wipe state is good, based on the detection result of the detector (step 1330).

The detector of this embodiment is the load sensor 114 or the ultrasonic generator 120. The load sensor 114 can detect the load in driving the cartridge 142 in the X direction when the press mechanism 112 presses the head 104 against the wiping table 149. The ultrasonic generator 120 can detect the oscillation impedance of the head 104. The detector may be provided to the wiping unit 140.

When the controller determines that the wipe state is good (step 1330), the controller closes the shutter 148 (step 1332) and the wiping unit controller 141 controls the drive stage 146 to retreat the wiping unit 140 (step 1334).

Next, the controller determines whether the residual amount of the wiping member is sufficient, based on the detection result of the torque detector 172 or the lever 178 and information shown in FIG. 16 stored in the memory etc. (step 1336). When the torque detector 172 is utilized, the step 1336 may be performed after the step 1308.

When the controller determines that the residual amount of the wiping member is insufficient (such as near-end) (step 1336), the controller indicates a message that prompts the user to exchange the wiping member through the main controller 102 (step 1338). The notice to the user is not limited to an indication of the message, such as blinking of the lamp, and an alarm sound using a buzzer.

On the other hand, when the controller determines that the wipe state is bad (step 1330), the controller returns to the step 1302 to reset the wiping condition. The oscillation impedance in the ultrasonic driving increases as a layer of the uncured underfill UF becomes thinner (or is reduced). The controller estimates the wipe state of the wipe operation from the oscillation impedance variation, and resets an optimal wiping condition. For example, when the oscillation impedance or the horizontal force in the X direction reaches a preset value or higher, wiping is stopped. When the oscillation impedance or the horizontal force in the X direction is below the preset value, the wiping amplitude is increased, a pressure by the press mechanism 112 is increased, a solvent supply amount is increased, or a wiping time period is extended.

Further, the invention is not limited to the disclosed exemplary embodiments, and various modifications and variations may be made. For example, while the ultrasonic bonding apparatus 100 of this embodiment mounts a flip-chip, the present invention is applicable to another electronic device, such as a BGA and a CSP.

The present invention can provide an ultrasonic bonding apparatus configured to maintain the cleanness of a tool surface

What is claimed is:

1. An ultrasonic bonding apparatus used to manufacture an electronic device that includes a substrate, an electronic component, and an underfill that is filled in a space between the electronic component and the substrate, said ultrasonic bonding apparatus comprising:
a head that includes a tool surface configured to mount the electronic component;
an ultrasonic bonding unit configured to ultrasonically bond the electronic component with the substrate; and
a wiping unit configured to wipe out pre-cured underfill that has adhered to the tool surface of the head, by using a wiping member on a wiping table,
wherein the wiping unit includes:
a solvent supply unit configured to supply a solvent configured to powder the underfill, to the wiping member on the wiping table;
a cartridge that is sealed, and configured to house the wiping table and a feed mechanism configured to supply the wiping member to the wiping table and to roll up the wiping member from the wiping table; and
a cartridge support member that includes a motor configured to drive the feed mechanism, and is detachably attached to the cartridge.

2. The ultrasonic bonding apparatus according to claim 1, further comprising a drive stage configured to drive the cartridge support member and attached to the cartridge support member.

3. The ultrasonic bonding apparatus according to claim 1, wherein an output shaft configured to associate with an operation of the feed mechanism is projected from the cartridge in a sealed state, and
wherein the cartridge support member further includes an output part connected to the output shaft, and a detector configured to detect a variation of the output part.

4. The ultrasonic bonding apparatus according to claim 3, further comprising a controller configured to recognize at least one of an end, a feed amount, and a residual amount of the wiping member based on a detection result of the detector.

5. The ultrasonic bonding apparatus according to claim 1, further comprising:
a brake plate provided to the cartridge support member, and configured to apply a tension to the wiping member against a rotation force of the motor;
a take-up reel that has a first shaft projecting from the cartridge in a sealed state, and is configured to roll up the wiping member from the wiping table; and
a feed reel that has a second shaft projecting from the cartridge in a sealed state, and is configured to feed the wiping member to the wiping table,
wherein one of a motor shaft of the motor and a rotation shaft of the brake plate is connected to the first shaft, and the other is connected to the second shaft.

6. The ultrasonic bonding apparatus according to claim 5, further comprising a controller configured to adjust the tension applied to the wiping member.

7. The ultrasonic bonding apparatus according to claim 3, each of the first shaft and the second shaft has a projection that has a pair of bevel surfaces having different inclination angles so that the first shaft can rotate to slack the wiping member when the first shaft is connected to the one and the second shaft can rotate to slack the wiping member when the second shaft is connected to the other.

8. An ultrasonic bonding apparatus used to manufacture an electronic device that includes a substrate, an electronic component, and an underfill that is filled in a space between the electronic component and the substrate, said ultrasonic bonding apparatus comprising:
a head that includes a tool surface configured to mount the electronic component;
an ultrasonic bonding unit configured to ultrasonically bond the electronic component with the substrate; and
a wiping unit configured to wipe out pre-cured underfill that has adhered to the tool surface of the head, by using a wiping member on a wiping table,
wherein the wiping unit includes:
a cartridge configured to house the wiping table;
a cartridge support member detachably attached to the cartridge; and
a drive stage configured to drive the cartridge support member and attached to the cartridge support member.

9. The ultrasonic bonding apparatus according to claim 8, further comprising a first orientation adjuster configured to adjust an orientation of the wiping member on the wiping table so that the wiping member can be parallel to the tool surface, the first orientation adjuster being provided between the cartridge support member and the drive stage.

10. The ultrasonic bonding apparatus according to claim 8, further comprising a second orientation adjuster fixed onto the drive stage on a side opposite to the cartridge support member and configured to adjust an orientation of the drive stage.

11. The ultrasonic bonding apparatus according to claim 2, wherein the drive stage swings the cartridge support member when the wiping unit provides wiping.

12. The ultrasonic bonding apparatus according to claim 1, further comprising a swing mechanism configured to swing the wiping table relative to the cartridge when the wiping unit provides wiping.

13. The ultrasonic bonding apparatus according to claim 12, wherein the swing mechanism includes:
   a decentering cam inserted into a cavity formed in the wiping table; and
   a motor connected to the decentering cam, provided on the cartridge support member, and configured to drive the decentering cam.

14. The ultrasonic bonding apparatus according to claim 12, further comprising a clamp mechanism configured to clamp the wiping member onto the wiping table, and an unclamp mechanism configured to release a clamp by the clamp mechanism.

15. The ultrasonic bonding apparatus according to claim 14, wherein the clamp mechanism includes a press plate configured to press the wiping member on the wiping table, and a forcing member configured to force the press plate in a clamping direction, and
   wherein the unclamp mechanism includes a unit to displace the press plate against a force applied by the forcing member.

16. The ultrasonic bonding apparatus according to claim 14, wherein each of the claim mechanism and the unclamp mechanism includes:
   a shutter housed in the cartridge, and configured to expose and close the wiping member on the wiping table; and
   a movement mechanism configured to move the shutter between an open position at which the shutter exposes and clamps the wiping member, and a close position at which the shutter closes and unclamps the wiping member.

17. The ultrasonic bonding apparatus according to claim 1, further comprising an elastic member located between the wiping table and the wiping member.

18. The ultrasonic bonding apparatus according to claim 1, wherein the wiping table has an uneven surface configured to contact the wiping member.

19. An ultrasonic bonding apparatus used to manufacture an electronic device that includes a substrate, an electronic component, and an underfill that is filled in a space between the electronic component and the substrate, said ultrasonic bonding apparatus comprising:
   a head that includes a tool surface configured to mount the electronic component;
   an ultrasonic bonding unit configured to ultrasonically bond the electronic component with the substrate; and
   a wiping unit configured to wipe out pre-cured underfill that has adhered to the tool surface of the head, by using a wiping member on a wiping table,
   wherein the wiping unit includes:
   the wiping table;
   a shutter configured to expose and close the wiping member on the wiping table; and
   a feed mechanism configured to supply the wiping member to the wiping table and to roll up the wiping member from the wiping table, in association with opening of the shutter.

20. The ultrasonic bonding apparatus according to claim 19, wherein the feed mechanism includes:
   a one-way clutch attached to a shaft of one of a take-up reel configured to take up the wiping member from the wiping table, and a feed reel configured to feed the wiping member to the wiping table, the one-way clutch rotating the shaft in association with the opening of the shutter; and
   a rack and pinion connected to the shutter and the one-way clutch.

* * * * *